US008055378B2

(12) United States Patent
Numakura

(10) Patent No.: US 8,055,378 B2
(45) Date of Patent: Nov. 8, 2011

(54) DEVICE FOR CONTROLLING PROCESSING SYSTEM, METHOD FOR CONTROLLING PROCESSING SYSTEM AND COMPUTER-READABLE STORAGE MEDIUM STORED PROCESSING PROGRAM

(75) Inventor: Masahiro Numakura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 612 days.

(21) Appl. No.: 12/203,509

(22) Filed: Sep. 3, 2008

(65) Prior Publication Data

US 2009/0076647 A1 Mar. 19, 2009

Related U.S. Application Data

(60) Provisional application No. 60/991,810, filed on Dec. 3, 2007.

(30) Foreign Application Priority Data

Sep. 18, 2007 (JP) ................................ 2007-241537

(51) Int. Cl.
*G06F 19/00* (2011.01)
*G06F 7/00* (2006.01)
(52) U.S. Cl. ......... 700/218; 700/121; 700/117; 700/109
(58) Field of Classification Search ........................ None
See application file for complete search history.

(56) References Cited

U.S. PATENT DOCUMENTS

| 6,795,745 B1 | 9/2004 | Okiguchi et al. | |
| 6,853,872 B2 * | 2/2005 | Nishihata et al. | ............. 700/121 |
| 2006/0129264 A1 * | 6/2006 | Tanaka et al. | ................ 700/109 |

FOREIGN PATENT DOCUMENTS

| JP | 11-67869 | | 3/1999 |
| JP | 11067869 A | * | 3/1999 |
| JP | 2001-93791 | | 4/2001 |
| JP | 2002-246377 | | 8/2002 |
| JP | 2002-252263 | | 9/2002 |

* cited by examiner

*Primary Examiner* — Gene Crawford
*Assistant Examiner* — Yolanda Cumbess
(74) *Attorney, Agent, or Firm* — Oblon, Spivak, McClelland, Maier & Neustadt, L.L.P.

(57) ABSTRACT

A processing system includes process modules, load lock modules, an equipment controller, and a machine controller. The equipment controller controls transfer and processing of wafers in the processing system. A transfer destination determining portion determines the transfer destination of each wafer such that each wafer is sequentially transferred to a normally operating process module. When an abnormality occurs in a process module, an evacuation portion temporarily evacuates to a cassette stage the wafer determined is to be transferred to the abnormal process module and that has not yet been transferred to the abnormal process module. When a new transfer destination of the evacuated wafer is determined, if a process that is performed immediately before processing the evacuated wafer in the processing module as the new transfer destination satisfies a predetermined condition, a transfer inhibition portion inhibits the transfer of the evacuated wafer to the new transfer destination.

15 Claims, 13 Drawing Sheets

DEVICE FOR CONTROLLING PROCESSING SYSTEM, METHOD FOR CONTROLLING PROCESSING SYSTEM AND COMPUTER-READABLE STORAGE MEDIUM STORED PROCESSING PROGRAM

CROSS REFERENCES TO RELATED APPLICATIONS

The present invention contains subject matter related to Japanese Patent Application JP 2007-241537 filed in the Japan Patent Office on Sep. 18, 2007 and Provisional Application No. 60/991,810, filed on Dec. 3, 2007, the entire contents of which being incorporated herein by reference.

BACKGROUND OF THE INVENTION

1. Field of the Invention

The present invention relates to a control device for a processing system that performs a predetermined process on an object to be processed, a control method for the processing system, and a storage medium that stores a processing program. More specifically, the present invention relates to a method for controlling transfer of an object to be processed.

2. Description of the Related Art

In recent years, most processing systems provided in semiconductor plants include a transfer mechanism that transfers objects to be processed, and two or more processing chambers in which a predetermined process is performed on each object to be processed. In this case, the method of transferring each object to be processed to a plurality of process containers is important to increase the throughput of the processing system and to improve productivity. Given this, in order to effectively process objects to be processed, there is a method in which the transfer destination of each object to be processed is determined such that each object to be processed is sequentially transferred to a plurality of processing chambers (hereinafter, also referred to as an OR transfer).

If an abnormality occurs in a given processing chamber during the OR transfer due to a malfunction or the like, it is favorable that the object to be processed that is scheduled to be transferred to the processing chamber in which the abnormality has occurred is evacuated once to a carrier, and then transferred to a normally operating processing chamber. By doing this, reduction in the overall throughput of the system is avoided to the extent possible. Accordingly, a technology has been proposed that optimizes the transfer route depending on an operating state of each of the processing chambers. If one of the processing chambers cannot be used due to a malfunction or the like, this technology enables effective processing of the object to be processed by using another processing chamber.

SUMMARY OF THE INVENTION

However, when the object to be processed that has been evacuated once is then transferred to a normal processing chamber and is subjected to a predetermined process, a defect may occur. For example, when the inside of the normal processing chamber is not adjusted to a stable condition, there is a possibility that the object to be processed that has been subjected to the process in the processing chamber will become a defective product. In this case, variation may be generated in properties of the defective product and the other objects to be processed in the same lot, and the quality of the entire lot cannot be ensured. Thus, there is a possibility that all the wafers included in the lot will not be able to be shipped as products.

For example, when a specified number of objects to be processed are processed or a specified processing time has elapsed, which are specified for each processing chamber, it is necessary to perform cleaning in order to adjust the atmosphere in the processing chamber. This cleaning is performed because the condition in the processing chamber changes due to adhesion of a reaction product to an inner wall of the processing chamber and due to a temperature change over time etc. of each member in the processing chamber. Therefore, there are times when a cleaning wafer is also transferred during the processing of product wafers.

Further, when a seasoning process using a lot stabilizing dummy wafer is performed to stabilize the condition in the processing chamber, the lot stabilizing dummy wafer is also transferred during the processing of product wafers. In this case, if an object to be processed is transferred to a processing chamber that has been subjected to the cleaning process but not subjected to the seasoning process, because the inside of the normal processing chamber has not been adjusted to a stable condition, the object to be processed that has undergone processing in the processing chamber may become a defective product.

Furthermore, after the atmosphere in the processing chamber in operation has been adjusted to receive the next lot, if the evacuated object to be processed included in the current lot is transferred to the processing chamber, the atmosphere in the processing chamber is changed by processing the transferred object to be processed. This may have an adverse effect on the processing of the next lot. For example, there is a case when, although each wafer should be transferred such that the cleaning process completes the processing of the lot, the object to be processed that has been evacuated once is transferred to the processing chamber after cleaning.

As described above, even when the processing chamber is operating normally, there is a case when the transfer of the object to be processed to the processing chamber should be inhibited depending on the content of the process that is performed immediately before processing the object to be processed. To address this, the present invention provides a control device for a processing system that, when optimizing the transfer route depending on the operating state of each of the processing chambers, if a predetermined condition is satisfied, inhibits the transfer of an object to be processed to a determined transfer destination based on the content of the immediately preceding process performed in the processing chamber. The present invention also provides a control method for the processing system, and a storage medium that stores a processing program.

According to an embodiment of the present invention, there is provided a control device for a processing system that includes a plurality of processing chambers in which a predetermined process is performed on an object to be processed, a storage port that stores objects to be processed, and a transfer mechanism that transfers each object to be processed to a predetermined transfer destination between the plurality of processing chambers and the storage port. The control device includes: a transfer destination determining portion that determines a transfer destination of each object to be processed that is stored in the storage port such that each object to be processed is sequentially transferred to a processing chamber that is operating normally among the plurality of processing chambers; an evacuation portion that, when transfer of an object to be processed to one of the plurality of processing chambers is inhibited, temporarily evacuates the object to be processed that it has been determined is to be transferred to the processing chamber to which the transfer is inhibited and that has not yet been transferred to the processing chamber to which the transfer is inhibited; and a transfer inhibition portion that, when the transfer destination determining portion determines a new transfer destination for the evacuated object to be processed, if a process that is performed immediately before processing the evacuated object to be processed in the processing chamber as the new transfer destination satisfies a predetermined condition, inhibits the transfer of the evacuated object to be processed to the new transfer destination.

With this configuration, the object to be processed that it has been determined is to be transferred to the processing chamber to which the transfer is inhibited due to occurrence of an abnormality or the like and that has not yet been transferred to the processing chamber to which the transfer is inhibited is evacuated once to the storage port. After that, when a new transfer destination for the object to be processed is determined, if the process that is performed immediately before processing the evacuated object to be processed in the processing chamber that is the new transfer destination satisfies a predetermined condition, the transfer of the evacuated object to be processed to the new transfer destination is inhibited.

According to another embodiment of the present invention, there is provided a control method for a processing system that includes a plurality of processing chambers in which a predetermined process is performed on an object to be processed, a storage port that stores objects to be processed, and a transfer mechanism that transfers each object to be processed to a predetermined transfer destination among the plurality of processing chambers and the storage port. The control method includes: determining a transfer destination of each object to be processed that is stored in the storage port such that each object to be processed is sequentially transferred to a processing chamber that is operating normally among the plurality of processing chambers; temporarily evacuating, when transfer of an object to be processed to one of the plurality of processing chambers is inhibited, the object to be processed that it has been determined is to be transferred to the processing chamber to which the transfer is inhibited and that has not yet been transferred to the processing chamber to which the transfer is inhibited; determining a new transfer destination for the evacuated object to be processed; and inhibiting the transfer of the evacuated object to be processed to the new transfer destination, if a process that is performed immediately before processing the evacuated object to be processed in the processing chamber that is the new transfer destination satisfies a predetermined condition.

According to another embodiment of the present invention, there is provided a storage medium storing a processing program that includes instructions that command a computer to execute control of a processing system that includes a plurality of processing chambers in which a predetermined process is performed on an object to be processed, a storage port that stores objects to be processed, and a transfer mechanism that transfers each object to be processed to a predetermined transfer destination among the plurality of processing chambers and the storage port. The processing program includes the processes of: determining a transfer destination of each object to be processed that is stored in the storage port such that each object to be processed is sequentially transferred to a processing chamber that is operating normally among the plurality of processing chambers; temporarily evacuating, when transfer of an object to be processed to one of the plurality of processing chambers is inhibited, the object to be processed that it has been determined is to be transferred to the processing chamber to which the transfer is inhibited and that has not yet been transferred to the processing chamber to which the transfer is inhibited; determining a new transfer destination for the evacuated object to be processed; and inhibiting the transfer of the evacuated object to be processed to the new transfer destination, if a process that is performed immediately before processing the evacuated object to be processed in the processing chamber that is the new transfer destination satisfies a predetermined condition.

According to the embodiments of the present invention described above, when the object to be processed that is scheduled to be transferred to the processing chamber in which an abnormality has occurred is transferred to a new transfer destination, the content of the immediately preceding process that is performed in the processing chamber that is the transfer destination is taken into consideration. If a predetermined condition is satisfied, the transfer to the transfer destination is inhibited. Thus, while maintaining a good condition in the processing chamber, production of defective products can be suppressed, and variation in properties of the products of the objects to be processed that have undergone processing can be inhibited. As a result, yield can be improved, and productivity can be increased.

DETAILED DESCRIPTION OF THE PREFERRED EMBODIMENT

Figure 1:
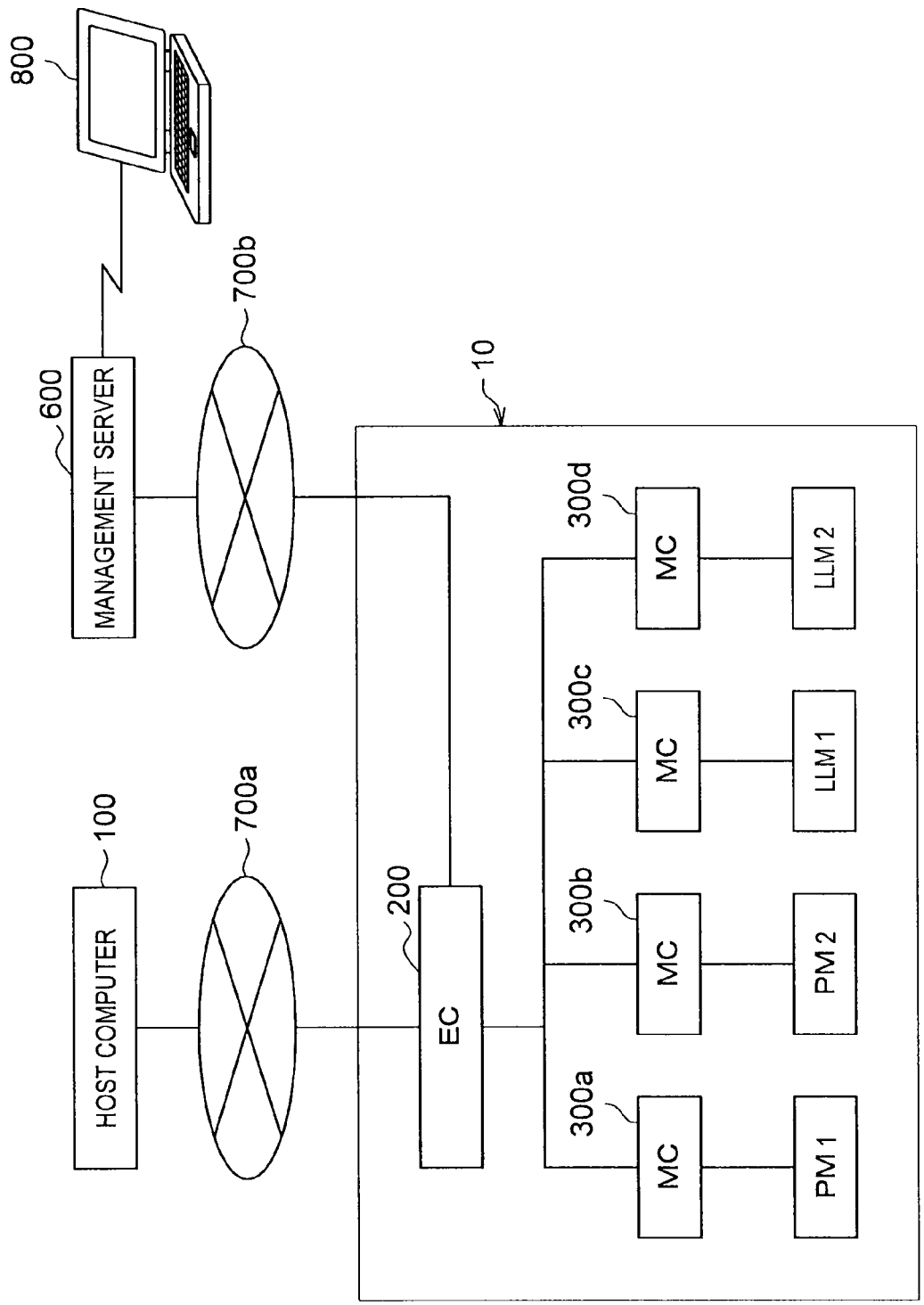
FIG. 1 is a conceptual diagram of a processing system according to an embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

First, an outline of a processing system according to one embodiment of the present invention will be described with reference to FIG. 1. Note that, in this embodiment, an example will be described in which an etching process is performed on a silicon wafer (hereinafter also referred to as a wafer W) using the processing system.

Outline of the Processing System

A processing system 10 includes an equipment controller (EC) 200, four machine controllers (MCs) 300a to 300d, two process modules PM1, PM2, and two load lock modules LLM1, LLM2.

The EC 200 is connected to a host computer 100 and a management server 600 via customer side local area networks (LANs) 700a, 700b, respectively. The management server 600 is connected to a data processor such as a personal computer (PC) 800. An operator issues a command to the processing system 10 by operating the PC 800. The EC 200, MCs 300a to 300d, PM1, PM2, LLM1 and LLM2 are provided in a plant, and mutually inter-connected by a LAN in the plant.

The host computer 100 manages the entire processing system 10 including data management. The EC 200 stores a system recipe that shows the procedure of a wafer etching process, and transmits a control signal to each of the MCs 300a to 300d to cause the PM1, PM2, LLM1 and LLM2 to operate according to the system recipe. The EC 200 also performs history management of the data after operation.

The MCs 300a to 300b store a process recipe, and drive each apparatus provided in the PM1 and PM2 according to the process recipe based on the control signal transmitted from the EC 200, thereby controlling the processing of the wafer W. Further, the MCs 300c to 300d drive each apparatus provided in the LLM1 and LLM2, thereby controlling the transfer of the wafer W.

The PM1 and PM2 are processing chambers in which a predetermined process, such as an etching process, is performed on the wafer W while the interior of the processing chambers is maintained in a predetermined vacuum state. The LLM1 and LLM2 are transfer chambers that transfer the wafer W from the atmosphere side into the PM in the vacuum state while the interior of the LLM1 and LLM2 is maintained in a predetermined reduced pressure state, and transfer the wafer W from the PM side to the atmosphere side. The management server 600 sets an operation condition of each device based on data transmitted from the PC 800 by operation of the operator.

Internal Structure of the Processing System

Figure 2:
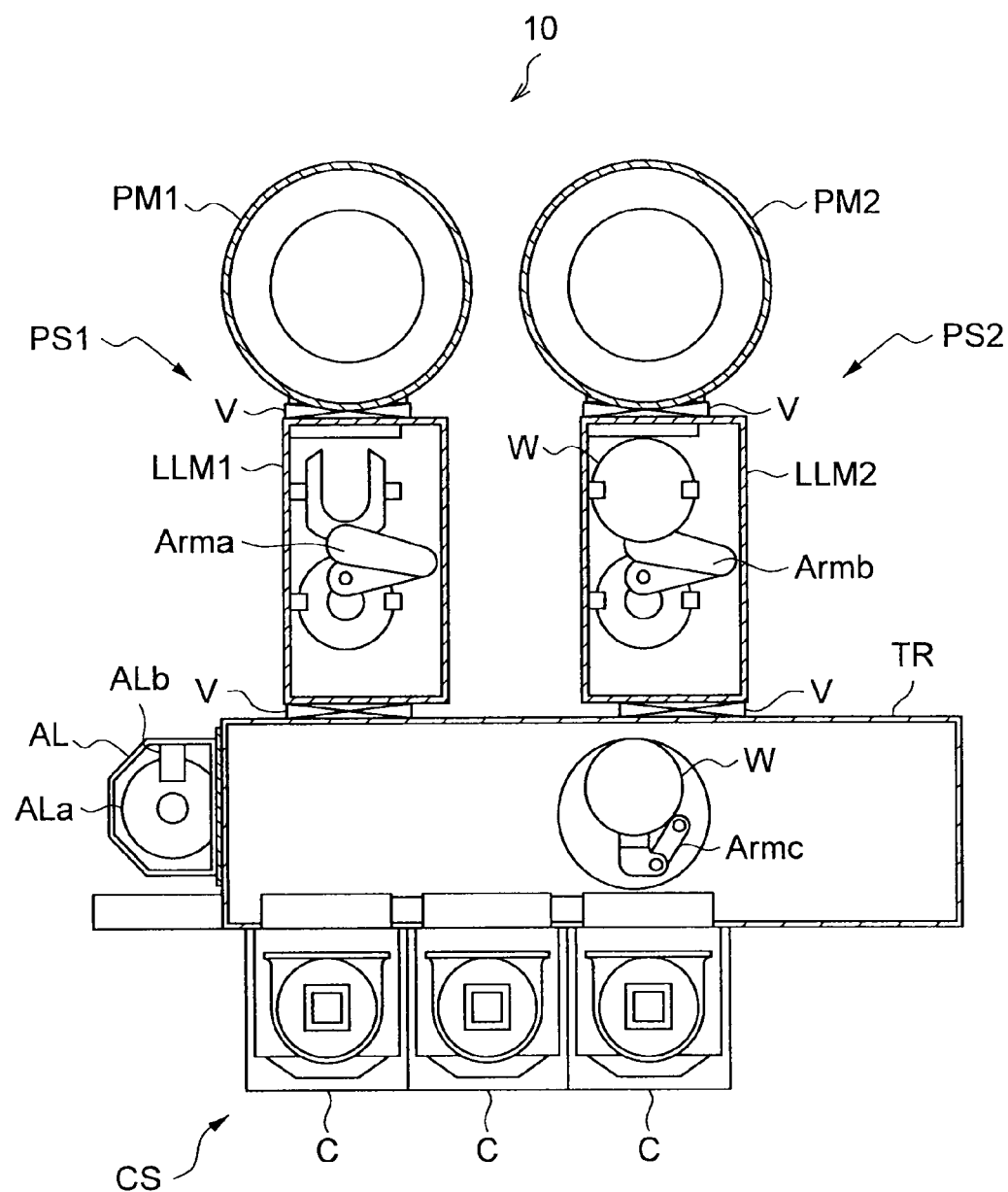
FIG. 2 is an internal configuration diagram of the processing system according to the embodiment.

Next, the internal configuration of the processing system 10 will be described with reference to FIG. 2. The processing system 10 includes a first process ship PS1, a second process ship PS2, a transfer unit TR, an alignment mechanism AL, and a cassette stage CS.

The first process ship PS1 includes the PM1 and the LLM1. The second process ship PS2 is disposed in parallel with the first process ship PS1, and includes the PM2 and the LLM2. The LLM1 and LLM2 transfer the wafers W gripped by respective transfer arms Arma, Armb, from the PM1 and PM2 to a transfer unit TR or from the transfer unit TR to the PM1 and PM2, while adjusting an internal pressure by opening and closing gate valves V that are provided at both ends of the LLM1 and LLM2.

The transfer unit TR is a rectangular transfer chamber, and is connected to the first process ship PS1 and the second process ship PS2. The transfer unit TR is provided with a transfer arm Armc, and transfers the wafer W using the transfer arm Armc in cooperation with the transfer arms Arma, Armb in the LLM1 and LLM2.

The alignment mechanism AL that performs an alignment of the wafer W is provided at one end of the transfer unit TR. The alignment mechanism AL rotates a turntable ALa that the wafer W is placed on to position the wafer W, and detects the state of a wafer peripheral section using an optical sensor ALb.

The cassette stage CS is provided at a side of the transfer unit TR. Three cassette cases C are placed on the cassette stage CS. A plurality of wafers W are stored in the respective cassette cases C in multiple levels.

With the above configuration, the respective wafers W stored in the respective cassette cases C are transferred from the cassette cases C via the transfer unit TR. After the alignment mechanism AL performs positioning, the wafers W are transferred, one by one, alternately to the process ships PS1 and PS2. Then, each wafer W is transferred to either the PM1 or PM2, through the LLM1 or LLM2. After the etching process, each wafer W is stored again in one of the cassette cases C via the respective mechanisms. A method for transferring the wafers W alternately to the PM1 and PM2 in this manner is referred to as an OR transfer.

Note that the PM1 and PM2 are one example of a plurality of processing chambers in which a predetermined process is performed on an object to be processed, and the cassette stage CS (the cassette cases C) is one example of a storage port that stores objects to be processed. Further, the transfer unit TR is one example of a transfer mechanism that transfers each object to be processed to a transfer destination, namely, between the plurality of processing chambers and the storage port. The EC 200 (or the MC 300) is one example of a device that controls the processing system 10. The LLM1 and LLM2 are one example of a pre-processing chamber connected to the respective processing chambers and the transfer mechanism.

Hardware Configuration of the EC and the MC

Next, the hardware configuration of the EC 200 will be described with reference to FIG. 3. Note that the hardware configuration of the MC 300 is the same as that of the EC 200, so a description thereof is omitted here.

Figure 3:
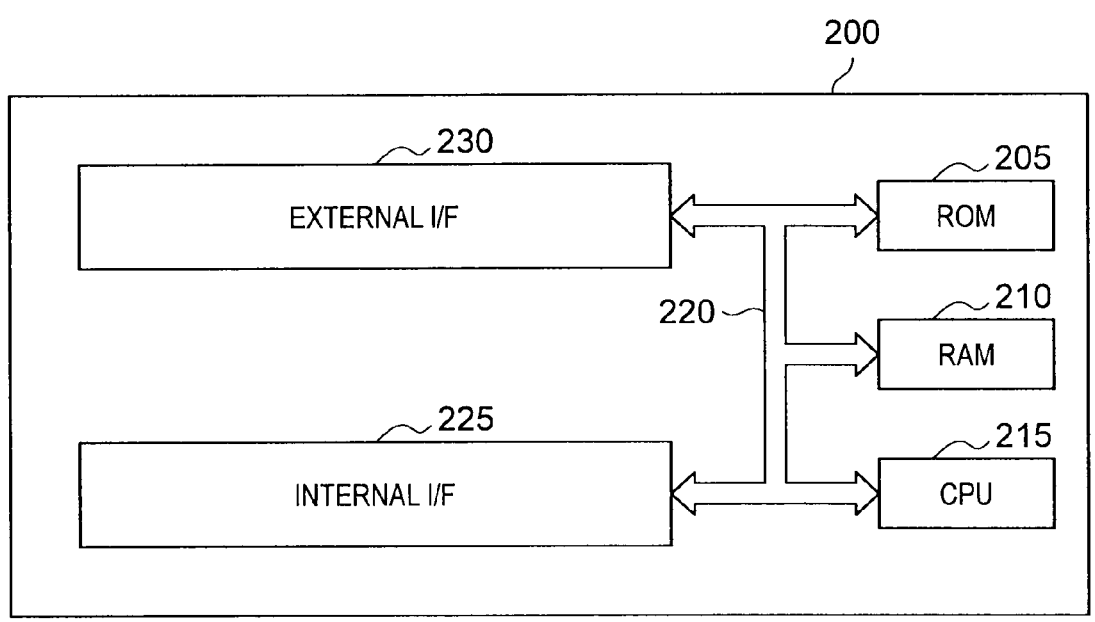
FIG. 3 is a hardware configuration diagram of an equipment controller (EC) according to the embodiment.

As shown in FIG. 3, the EC 200 includes a ROM 205, a RAM 210, a CPU 215, a bus 220, an internal interface (an internal I/F) 225, and an external interface (external I/F) 230.

A program to control a transfer process, a program to control a wafer process, a program that starts when abnormality occurs, and various recipes are recorded in the ROM 205. Various programs and data are stored in the ROM 210. Note that the ROM 205 and the RAM 210 are one example of a storage device. The ROM 205 and the RAM 210 may be a storage device, such as an EEPROM, an optical disk, or a magneto optical disk.

The CPU 215 controls the transfer and processing of wafers according to the various recipes. The bus 220 is a route for exchanging data between respective devices, namely, the ROM 205, the RAM 210, the CPU 215, the internal interface 225, and the external interface 230.

The internal interface 225 inputs data, and outputs necessary data to a monitor, a speaker (not shown in the figures), etc. The external interface 230 transmits and receives data between devices connected by a network such as a LAN.

Functional Structure of the EC

Figure 4:
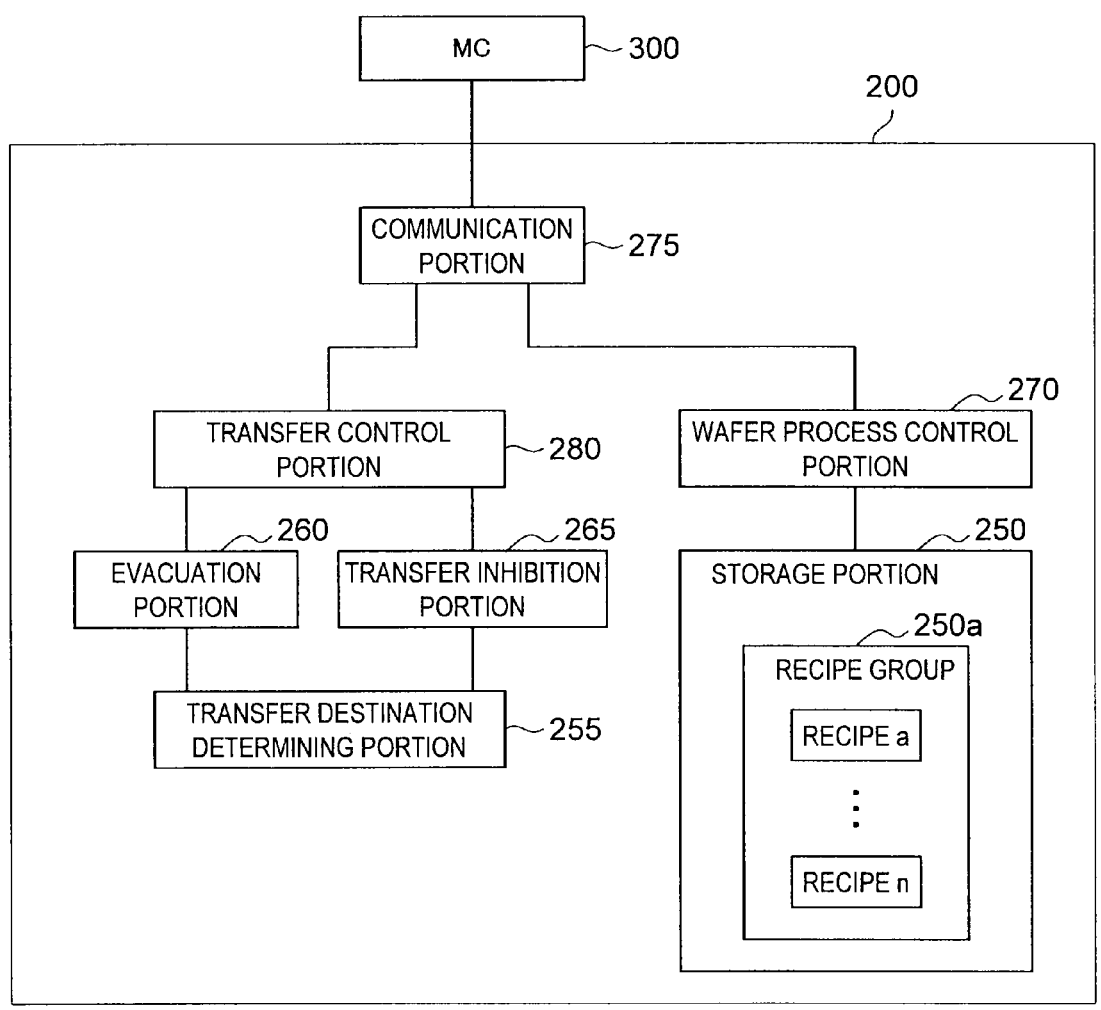
FIG. 4 is a functional configuration diagram of the EC according to the embodiment.

Next, the functional structure of the EC will be described with reference to FIG. 4 that shows respective functions of the EC 200 using blocks. The EC 200 has functions shown by respective blocks that include a storage portion 250, a transfer destination determining portion 255, an evacuation portion 260, a transfer inhibition portion 265, a wafer process control portion 270, a communication portion 275, and a transfer control portion 280.

The storage portion 250 stores a recipe group 250a (recipe a to recipe n) that shows the processing procedure for applying a desired process to the wafer W in the PM1 and PM2. The transfer destination determining portion 255 determines the transfer destination of each wafer W stored in the cassette cases C on the cassette stage CS so that each wafer W is sequentially OR-transferred to a normally operating PM out of the PM1 and PM2.

In a case where transfer of the wafer W to either the PM1 or PM2 is inhibited, the evacuation portion 260 evacuates the wafer W to the cassette stage CS once. In this case, the wafer W is a wafer that it has been determined is to be transferred to the PM to which the transfer is inhibited, and has not yet been transferred to the PM to which transfer is inhibited. Examples of cases where the transfer of the wafer W to the PM is inhibited include when periodic maintenance of the PM is performed and when an abnormality (an error) occurs in the PM.

In a case where the transfer destination determining portion 255 determines a new transfer destination for the evacuated wafer W, if the process that is performed immediately before processing the evacuated wafer W in the PM that is the new transfer destination satisfies a predetermined condition, the transfer inhibition portion 265 inhibits the transfer of the evacuated wafer W to the new transfer destination.

The wafer process control portion 270 selects the recipe specified by the operator from among the recipes stored in the storage portion 250, and outputs a driving signal for controlling the etching process performed in each PM according to the procedure of the recipe. The communication portion 275 mainly transmits and receives information to and from the MC 300. The communication portion 275 transmits a driving signal for processing wafers to the MC 300.

The transfer control portion 280 outputs a signal to transfer a predetermined wafer to a predetermined position, in accordance with instructions from the transfer destination determining portion 255, the evacuation portion 260 and the transfer inhibition portion 265. The communication portion 275 transmits the aforementioned signal to the MC 300 in order to provide instructions about the transfer destination of each wafer.

Note that the functions of the respective portions of the EC 200 described above are actually achieved by reading a processing program from a storage medium, such as the ROM 205 or the RAM 210, that stores the processing program (including recipes) in which the processing procedure for the CPU 215 of FIG. 3 to realize these functions is written, and by interpreting and executing the processing program. For example, in this embodiment, the respective functions of the transfer destination determining portion 255, the evacuation portion 260, the transfer inhibition portion 265, the wafer process control portion 270, and the transfer control portion 280 are actually achieved by the CPU 215 executing the program in which the processing procedure to realize these functions are written.

Operation of the EC

Figure 5:
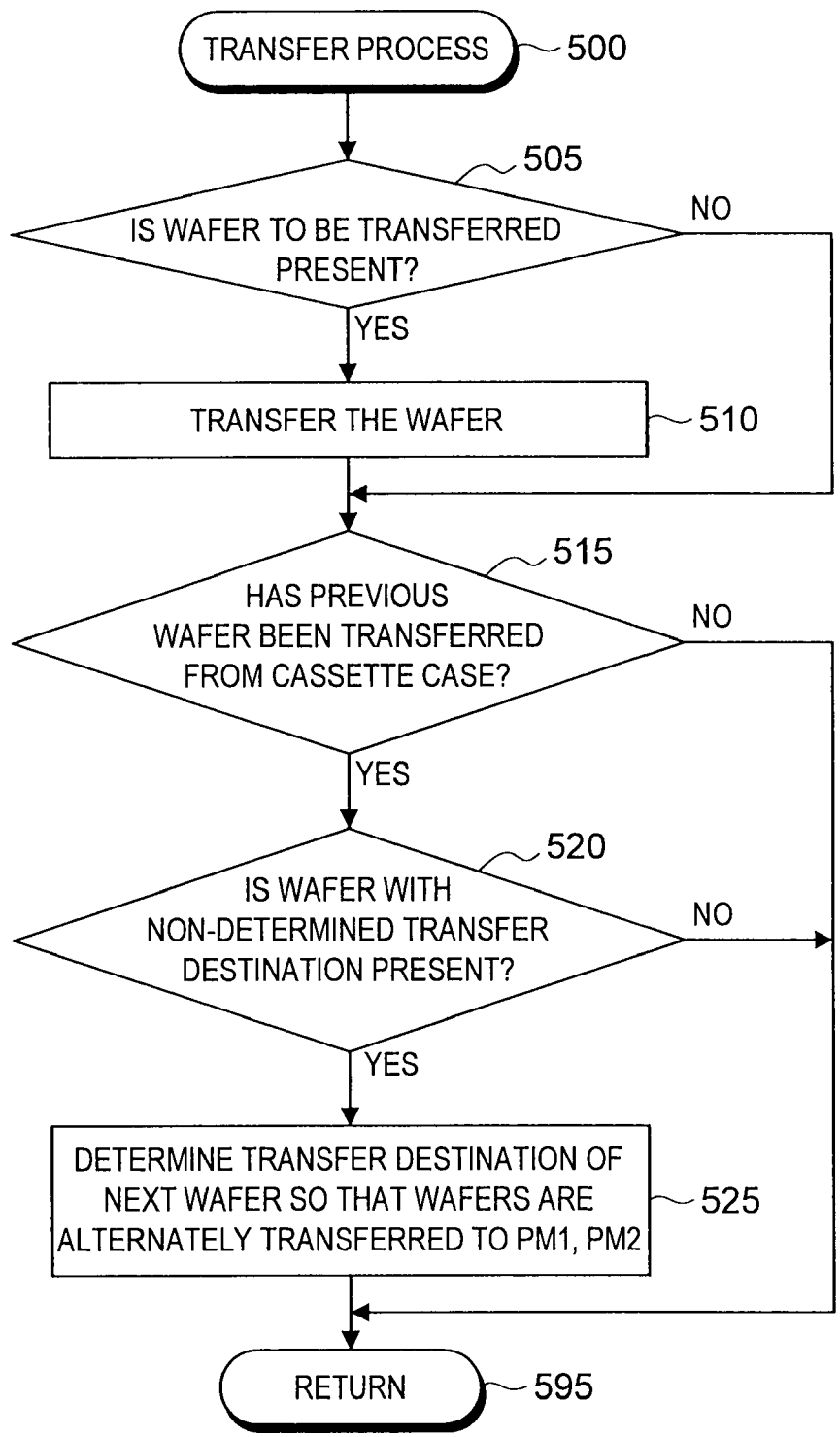
FIG. 5 is a flowchart showing a transfer process routine that is performed in the embodiment.
Figure 6:
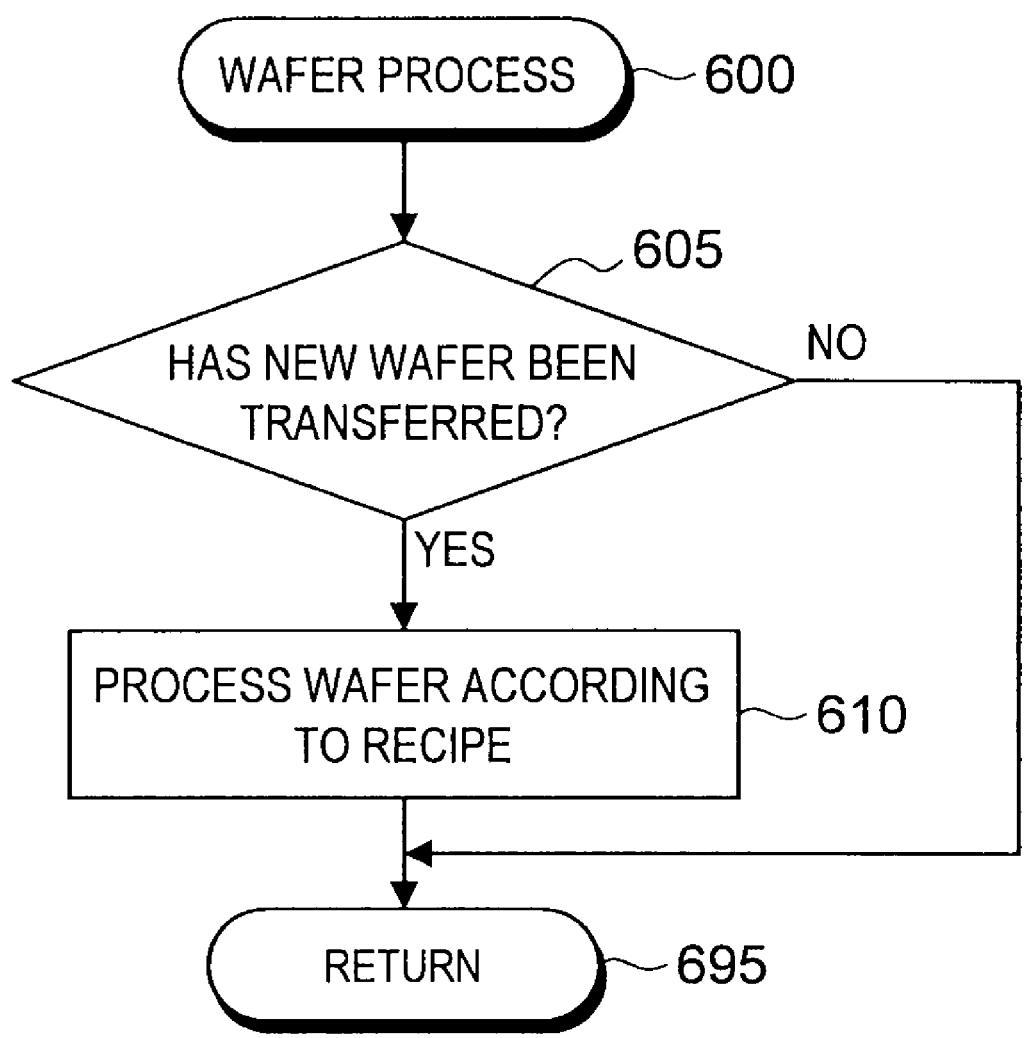
FIG. 6 is a flowchart showing a wafer process routine that is performed in the embodiment.
Figure 7:
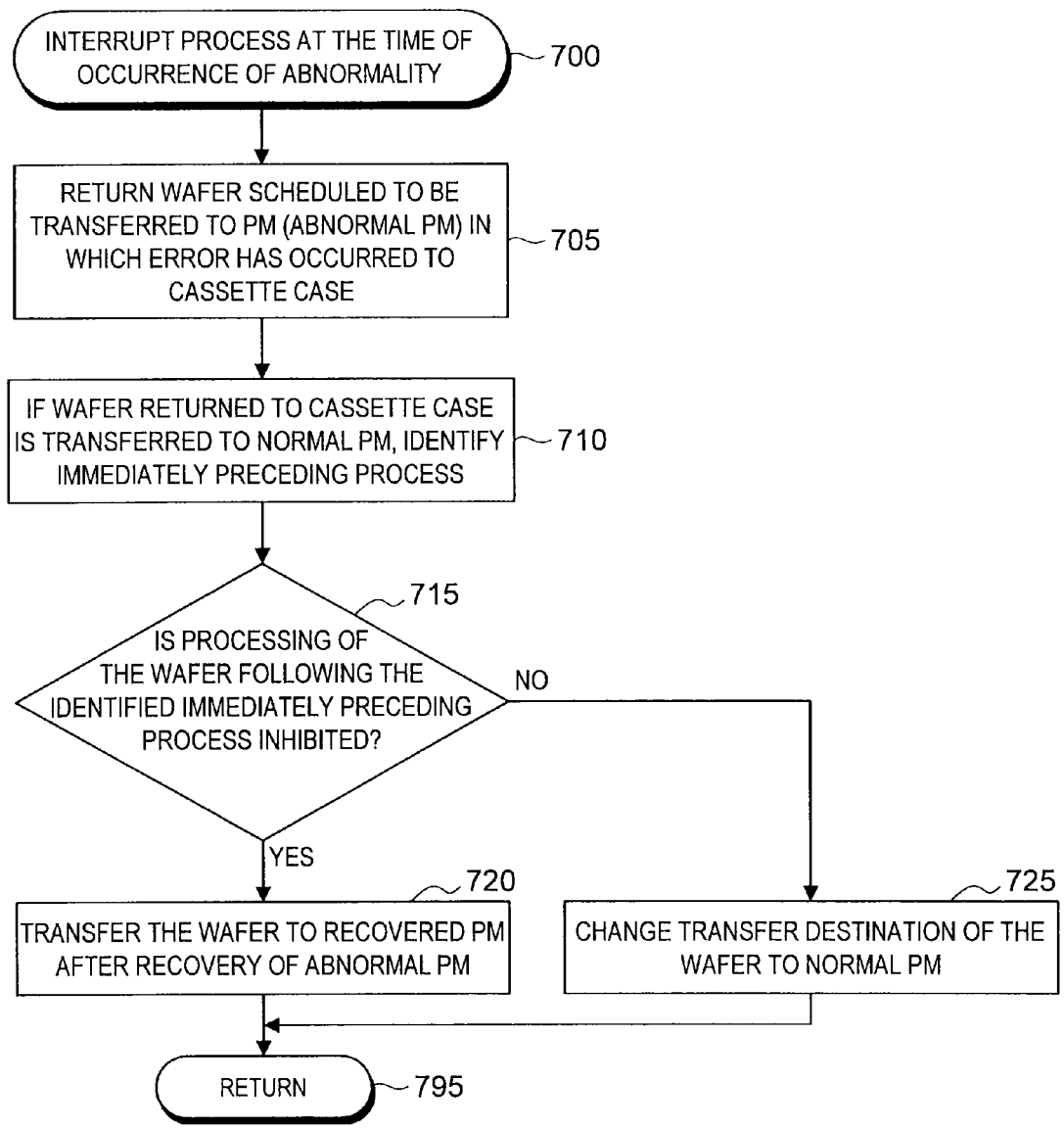
FIG. 7 is a flowchart showing an interrupt process routine at the time of occurrence of abnormality that is performed in the embodiment.

Next, the transfer process, the wafer process, and the interrupt process at the time of occurrence of abnormality that are performed by the EC 200 will be described. The transfer process shown in a flowchart in FIG. 5, and the wafer process shown in a flowchart in FIG. 6 are separately activated at predetermined intervals. The interrupt process at the time of occurrence of abnormality shown in a flowchart in FIG. 7 is activated as an interrupt process when an abnormality occurs.

When the operator specifies the recipe and the lot number and turns on a lot start button, the lot is loaded, and preparation for sequentially transferring wafers included in the lot is completed. In accordance with this timing, the transfer process shown in FIG. 5 is started from step 500, and the wafer process shown in FIG. 6 is started from step 600.

Figure 8A:
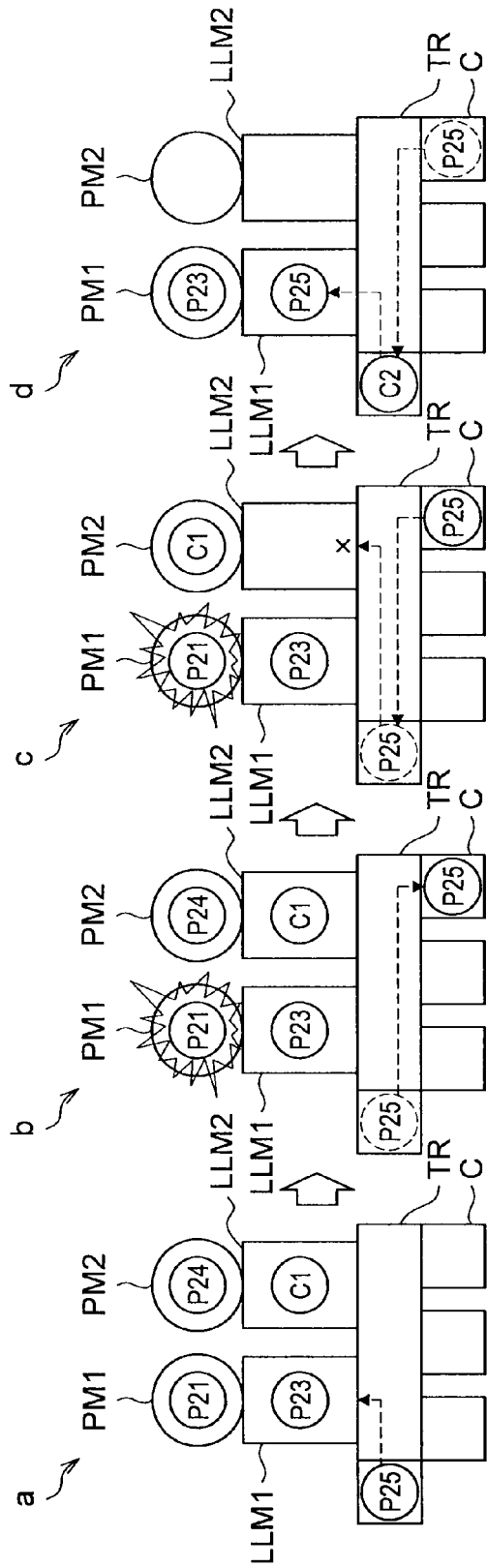
FIG. 8A is a diagram showing the transfer state in the processing system according to the embodiment.
Figure 8B:
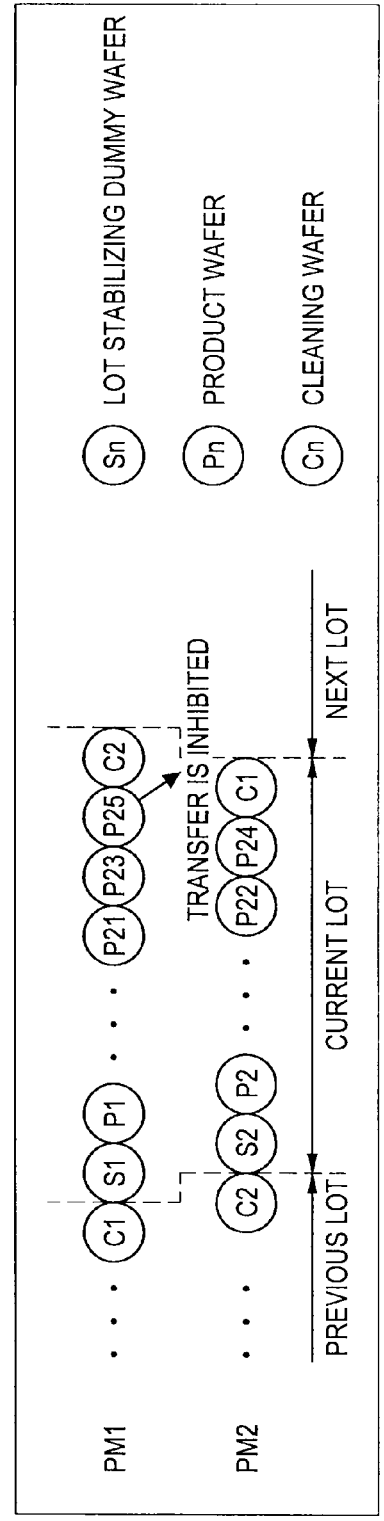
FIG. 8B is a diagram for explaining the transfer state shown in FIG. 8A.

In this embodiment, as shown in FIG. 8B, each lot includes three types of wafers, i.e., 25 sheets of product wafers P1 to P25, wafers for a cleaning process (cleaning wafers C1, C2), wafers for a seasoning process (lot stabilizing dummy wafers S1, S2).

When the number of the processed product wafers reaches a number of sheets determined for each PM, or the processing time of the product wafers reaches a processing time determined for each PM, it is necessary to perform cleaning in order to adjust the atmosphere in the processing chamber. This cleaning is performed because the condition in the processing chamber changes due to adhesion of a reaction product to an inner wall of the PM and due to a temperature change over time etc. of each section inside the PM. Therefore, in this embodiment, after processing the 25 sheets of product wafers (that is, at the end of the lot), the cleaning wafers C1, C2 are transferred to clean the PM1 and PM2. Thus, the atmosphere in the PM1 and PM2 is adjusted to a suitable condition for receiving the next lot.

Further, after the above-described cleaning, there is a case when the seasoning process using the lot stabilizing dummy wafers is performed in order to stabilize the condition in the processing chambers. In this embodiment, the seasoning process using the lot stabilizing dummy wafers S1, S2 is performed at the beginning of the current lot, in order to stabilize the inside of the PM1 and PM2 to an extent that the processing of the product wafers can be performed.

In a normal state where the PM1 and PM2 are operating normally, the transfer destination of each wafer W is determined such that the wafers W are transferred, one by one, alternately to the PM1 and PM2 (OR transfer). Accordingly, it is determined that the first lot stabilizing dummy wafer S1 of the lot number specified by the operator is transferred to the PM1, and is determined that the second lot stabilizing dummy wafer S2 is transferred to the PM2.

Transfer Process

The transfer process is started from step 500 of FIG. 5, and the transfer control portion 280 determines at step 505 whether or not a wafer to be transferred is present. At this time point, the stabilizing dummy wafers S1, S2 to be transferred are present. Therefore, the transfer control portion 280 outputs an instruction signal to transfer the wafers S1, S2 to the respective transfer destinations PM1, PM2. This instruction signal is transmitted from the communication portion 275 to the MC 300, and the MC 300 performs control to cause the transfer mechanism of each PM to be driven. Thus, the OR transfer of each wafer is started. When there is no wafer to be transferred, the process skips step 510 and proceeds to the next step 515.

The transfer destination determining portion 255 determines at step 515 whether or not the previous wafer has been transferred from the cassette case C. Generally, in the processing system 10, the wafer transfer takes more time than the wafer process. Especially, this tendency is conspicuous for a process that takes a short time. Therefore, in the transfer process of this embodiment, the transfer destination of the next wafer is determined at a timing when the previous wafer is carried out from the cassette case C toward the transfer unit TR so that there is no waiting time until the next wafer to be processed is transferred to the PM after the processed wafer is transferred from the PM based on the above rate-controlled manner.

Note that, instead of determining the transfer destination of the next wafer in accordance with the timing when the previous wafer is carried out from the cassette case C toward the transfer unit TR as described above, the transfer destination determining portion 255 may determine the transfer destination of the next wafer in accordance with the timing when the previous wafer is carried out from the transfer unit TR toward the LLM.

At this time point, the wafers S1, S2 have already been transferred from the cassette case C. Therefore the process proceeds to step 520, and the transfer destination determining portion 255 determines whether or not the wafer, the transfer destination of which has not been determined, is present in the specified lot. At this time point, the transfer destinations of the wafers P1, P2 . . . P25, and C1, C2 included in the current lot have not been determined. Therefore, the process proceeds to step 525, and the transfer destination determining portion 255 determines that the next wafer P1 is to be transferred to PM1 so that each wafer is transferred alternately to the PM1 and PM2. Then, the process proceeds to step 595 and the process is terminated once.

On the other hand, when it is determined at step 515 that the previous wafer has not been transferred from the cassette case C, or when it is determined at step 520 that the wafer, the transfer destination of which has not been determined, is not present in the specified lot, the process immediately proceeds to step 595 and the process is terminated once.

Wafer Process

The wafer process is started from step 600 of FIG. 6, and the wafer process control portion 270 determines at step 605 whether or not a new wafer has been transferred. When a new wafer has been transferred, the process proceeds to step 610, and the wafer process control portion 270 performs control such that the etching process is performed on the wafer according to a recipe that is specified by the operator from the recipe group 250a stored in the storage portion 250. Then, the process proceeds to step 695 and the process is terminated once. When there is no newly transferred wafer, the process immediately proceeds to step 695 and the process is terminated once.

Transfer Situations and Issues that can Occur During the OR Transfer

In the OR transfer as described above, for example, when the recipe time of the PM1 is longer than the recipe time of the PM2 by more than a minute or when a difference between the recipe time of the PM1 and the recipe time of the PM2 becomes longer than a minute as a result of skipping a recipe in the PM2, the wafer that has been transferred from the cassette case C toward the process ship PS2 may overtake the wafer that has already been transferred from the cassette case C toward the process ship PS1.

Figure 12:
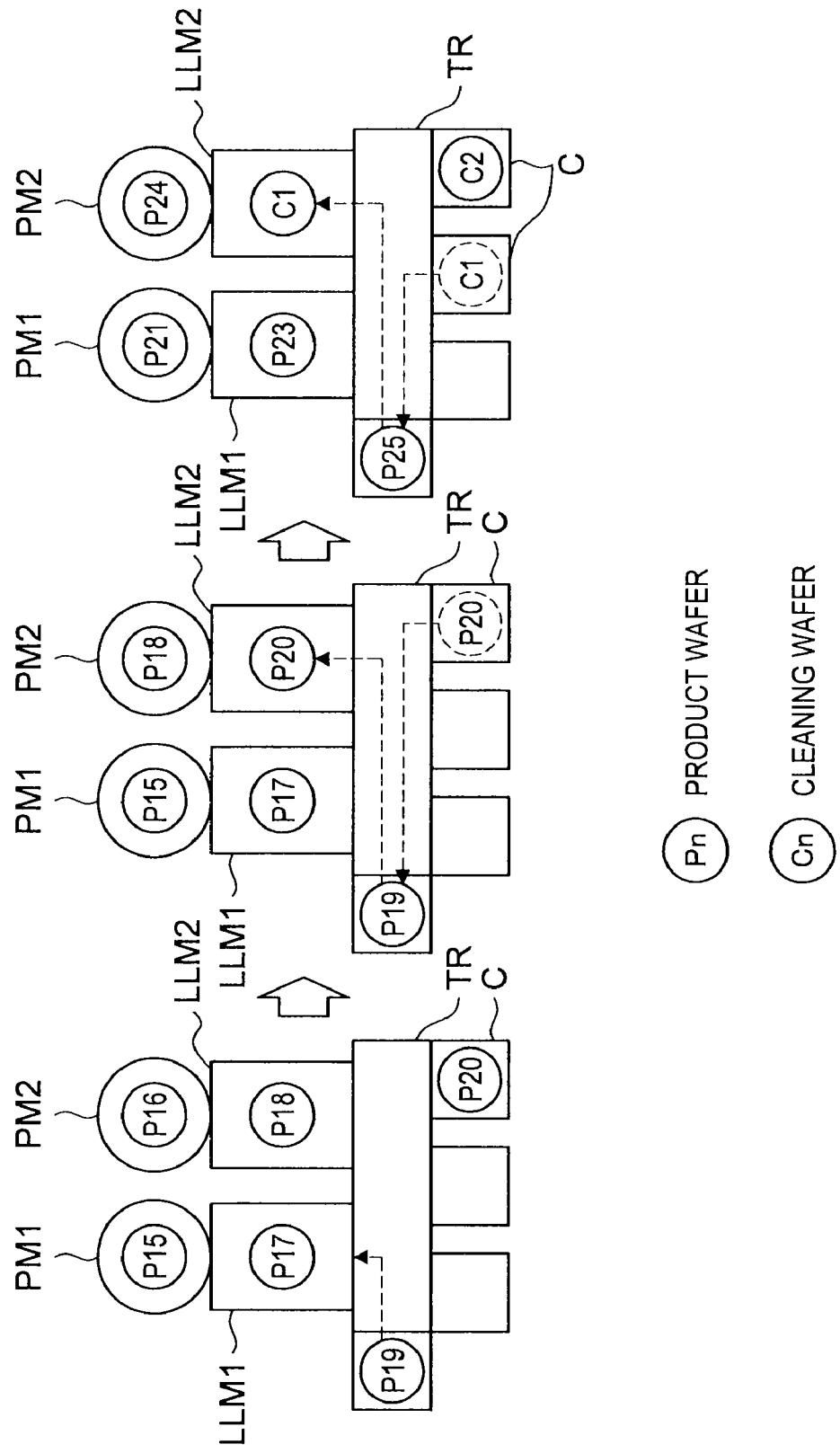
FIG. 12 is a diagram showing the transfer state in a related processing system.

For example, in the process shown in FIG. 12, because the recipe time of the PM1 is longer than the recipe time of the PM2 by more than a minute, the wafer P20 that has been transferred from the cassette case C toward the process ship PS2 overtakes the wafer 19 that has already been transferred from the cassette case C toward the process ship PS1. As a result, the wafer 20 is transferred to the LLM2 before the wafer 19 is transferred to the LLM1.

If the OR transfer is further continued, after the product wafer P25 has been transferred from the cassette case C, the cleaning wafer C1 transferred toward the process ship PS2 overtakes the product wafer P25 and is transferred to the LLM2.

Figure 13A:
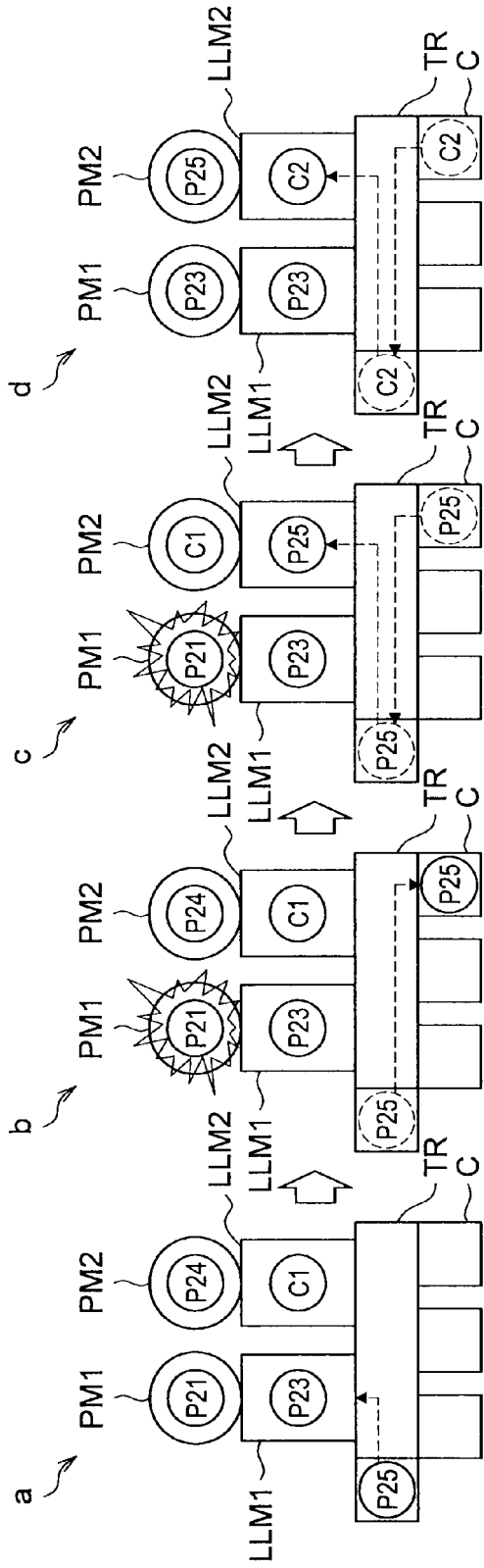
FIG. 13A is another diagram showing the transfer state in the related processing system.
Figure 13B:
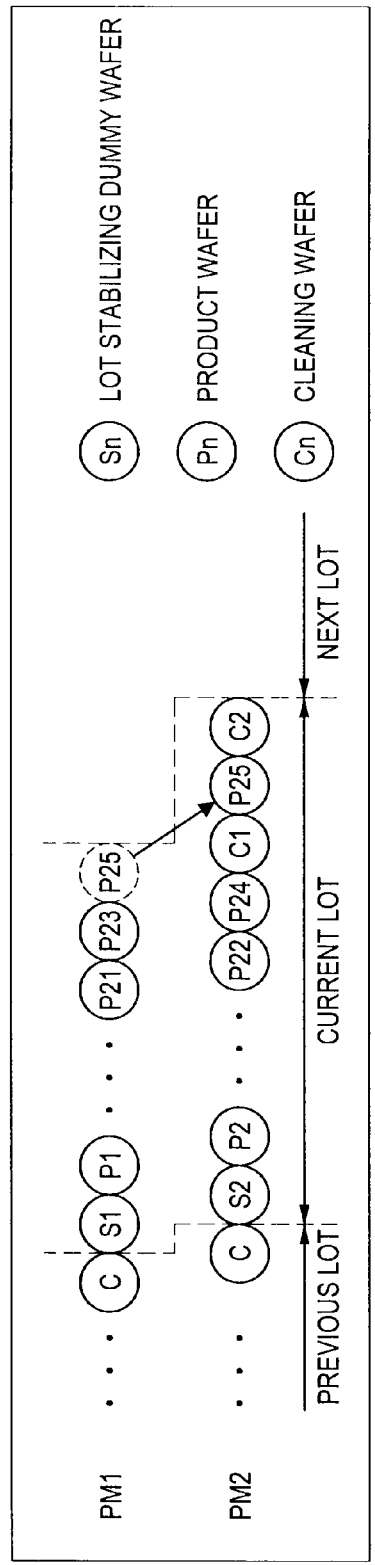
FIG. 13B is a diagram for explaining the transfer state shown in FIG. 13A.

Next, issues that may occur in such transfer situations will be described with reference to FIGS. 13A and 13B. As shown in FIG. 13A(a), in a state where the process on the process ship PS2 side overtakes the process on the process ship PS1 side, if the transfer of the wafer to the PM1 is inhibited due a failure occurring in the PM1 as shown in FIG. 13 A(b), because the wafer P25 scheduled to be transferred to the PM1 has not yet been transferred to the PM1, the wafer P25 is returned once to the cassette case C.

If transfer efficiency is taken into consideration, rather than making the product wafer P25 standby until the PM1 is recovered it is preferable to determine the operating PM2 as the new transfer destination of the product wafer P25, and to transfer the product wafer P25 to the process ship PS2 so that the etching process is performed on the product wafer P25 in the PM2.

If the product wafer P25 is transferred to the process ship PS2 and the etching process is performed in the PM2 as shown in FIG. 13 A(c), although the inside of the PM2 has been adjusted to receive the next lot by the immediately preceding cleaning process using the cleaning wafer C1, the atmosphere in the PM2 is changed by the processing of the product wafer P25 included in the current lot. This may have an adverse effect on the processing of the next lot.

In addition, the PM2 has been subjected to the cleaning process, but has not yet been subjected to the seasoning process. Therefore, the internal atmosphere is not adjusted to a state that is stable enough to process the product wafer P25. As a result, there is a possibility that the product wafer P25 that has been subjected to the etching process in the PM2 will become a defective product. Accordingly, variation may be generated in properties of the product wafer P25 and the other processed product wafers in the current lot, and it may be determined in a later process that at least one of the product wafers included in the current lot is a product that has inadequate quality for shipping as a product. Thus, there is a possibility that all the product wafers in the current lot will not be able to be shipped as products.

In addition, the atmosphere in the PM2 is changed to some degree by processing the product wafer of the current lot. Accordingly, a further process is required to adjust the inside of the PM2 to an atmosphere to receive the next lot.

As described above, even when the PM is operating normally, there is a case when the transfer of the wafer should be inhibited depending on the content of the process that is performed immediately before processing the evacuated wafer. To address this, in the interrupt process at the time of occurrence of abnormality of this embodiment, when the wafer that has been evacuated once is transferred to the PM that is the new transfer destination, the process that is performed immediately before processing the evacuated wafer in the transfer destination PM is taken into consideration. As a result, if necessary, the transfer of the wafer to the new transfer destination is inhibited.

Hereinafter, the interrupt process at the time of occurrence of abnormality will be described with reference to a flowchart shown in FIG. 7. Note that, when an abnormality occurs in the PM, an interrupt signal indicating the abnormality occurring in the PM is output from the MC 300 to the EC 200. Here, during the OR transfer, when the product wafer P21 is processed in the PM 1 shown in FIG. 8A(b), an abnormality occurs in the PM1. Then, the interrupt signal is output from the MC 300a that manages the PM1 to the EC 200. The CPU 215 of the EC200 receives the interrupt signal and performs the interrupt process at the time of occurrence of abnormality as shown in FIG. 7.

Interrupt Process at the Time of Occurrence of Abnormality

The interrupt process at the time of occurrence of abnormality is started from step 700. Then, at step 705, the evacuation portion 260 evacuates, to the cassette case C, the wafer that is scheduled to be transferred to the PM in which an abnormality (an error) has occurred (hereinafter the PM in which an abnormality has occurred is also referred to as the abnormal PM) and that has not yet been transferred. In the case shown in FIG. 8B, the abnormal PM1 is determined to be the transfer destination, and the product wafer P25 that has not yet been transferred is evacuated once to the cassette case C. Here, the evacuation portion 260 determines whether or not the wafer has been transferred based on whether or not the wafer has been transferred to the LLM. More specifically, when the abnormality occurs in the PM1, it is determined that the product wafers P21, P23, P24, C1 have been transferred, but the product wafer P25 has not been transferred.

Then, the process proceeds to step 710, and if it is determined that the product wafer P25 is transferred to the PM that is operating normally (hereinafter the PM that is normally operating is also referred to as the normal PM), the transfer inhibition portion 265 identifies the process that is performed in the normal PM immediately before processing the evacuated wafer. In the case shown in FIG. 8A(b), the cleaning wafer C1 has been transferred to the LLM. Accordingly, the process that is performed immediately before processing the evacuated wafer P25 when the evacuated wafer P25 is transferred to the PM2 is identified as the cleaning process.

Then, the process proceeds to step 715, and the transfer inhibition portion 265 determines, based on a predetermined condition, whether or not the processing of the evacuated wafer following the identified immediately preceding process is inhibited. An example of the predetermined condition is a case when the inside of the PM has not been adjusted to a condition that is stable enough to process the next product wafer by the process performed immediately before processing the evacuated wafer.

More specifically, there is a case when the process immediately before processing the evacuated wafer is not the cleaning process when the transfer destination PM should be cleaned. Also, there is a case when the process immediately before processing the evacuated wafer is not the seasoning process when the inside of the transfer destination PM after cleaning should be seasoned.

In such cases, the inside of the transfer destination PM has not been adjusted to a condition good enough to process the product wafer. Accordingly, if the evacuated wafer is processed by an apparatus in the PM, there is a possibility that the evacuated wafer will become a defective product. Further, variation may be generated in the properties of the product wafers included in the current lot.

Another example of the predetermined condition to inhibit the transfer of the evacuated wafer is a case when the inside of the PM has been adjusted, by the process performed immediately before processing the evacuated wafer, to a condition to receive a lot next to the lot including the evacuated wafer.

More specifically, there is a case when the inside of the PM has been adjusted to a condition to receive the next lot by the cleaning process performed immediately before processing the evacuated wafer. Further, there is a case when the inside of the PM has been adjusted to a condition to receive the next lot by the seasoning process performed immediately before processing the evacuated wafer.

In such cases, the inside of the transfer destination PM has been adjusted to a condition to receive the next lot. Accordingly, if the wafer in the current lot is processed by the apparatus in the PM, there is a possibility that the evacuated wafer will become a defective product. Further, variation may be generated in the properties of the wafers included in the current lot and the wafers included in the next lot.

In each of the above-described cases, if variation is generated in the properties of the wafers in the same lot, it may be determined in a later process that at least one of the product wafers included in the lot is a product with a quality below an acceptable level as a product. Thus, there is a possibility that all the product wafers included in the lot will not be able to be shipped as products.

In addition, the atmosphere in the transfer destination PM is changed to some degree by processing the product wafer of the current lot. Accordingly, a further process is required to adjust the inside of the transfer destination PM to an atmosphere to receive the next lot. This may reduce the overall throughput of the processing system 10.

For example, in the situation shown in FIG. 8A(c), if the product wafer P25 is transferred to the process ship PS2 and the etching process is performed thereon in the PM2, although the inside of the PM2 has been adjusted to a condition to receive the next lot by the immediately preceding cleaning process using the cleaning wafer C1, the atmosphere in the PM2 is changed by processing the product wafer P25 of the current lot. This may have an adverse effect on the process of the next lot.

Further, the PM2 has been subjected to the cleaning process, but not to the seasoning process. Therefore, the inside of the PM has not been adjusted to a condition that is stable enough to process the product wafer. As a result, there is a possibility that the product wafer P25 that has been subjected to the etching process will become a defective product, and variation may be generated in the properties of the product wafer P25 and the other product wafers in the same lot. Thus, there is a possibility that all the product wafers included in the current lot will not be able to be shipped as products.

In addition, the atmosphere in the PM2 is changed to some degree by processing the product wafer P25 of the current lot. Accordingly, a further process is required to adjust the inside of the PM2 to an atmosphere to receive the next lot.

To address this, in the interrupt process at the time of occurrence of abnormality according to the embodiment, when in the above-described transfer situations, the transfer inhibition portion 265 determines "YES" at step 715 of FIG. 7. Then, the process proceeds to step 720, and the transfer destination determining portion 255 determines the transfer destination such that, after the abnormal PM has been recovered, the evacuated wafer is transferred to the recovered PM.

As a result, as shown in FIG. 8A(d), the evacuated wafer P25 is transferred to the LLM1 after the PM1 has been recovered, and processed in the PM1. Thus, as shown in FIG. 8, by inhibiting the transfer of the evacuated wafer P25 to the normally operating PM2, the last wafers of the current lot that are processed in the PM1 and PM2 are cleaning wafers C1, C2. Accordingly, the properties of all the product wafers in the same lot can be kept in a good condition without variation. As a result, a high yield can be maintained. In addition, because the inside of all the PMs has been adjusted to an atmosphere to receive the next lot when the process of the current lot is completed, the process of the next lot can be started smoothly.

When it is determined at step 715 of FIG. 7 that the transfer of the evacuated wafer to the normal PM is not inhibited, the process proceeds to step 725, and the transfer destination determining portion 255 changes the transfer destination of the evacuated wafer to the normal PM. As a result, the evacuated wafer can be processed without waiting for the recovery of the abnormal PM, and the wafers in the current lot can be effectively processed even when an abnormality occurs.

Interrupt Process at the Time of Occurrence of Abnormality in Other Transfer Situations Next, the interrupt process at the time of occurrence of abnormality in other transfer situations will be described. Here, as shown in FIG. 9, the cleaning process using the cleaning wafers C1, C2 is performed at the beginning of each lot. Then, the seasoning process using the lot stabilizing dummy wafers S1, S2 is performed to adjust the inside of the PM1, PM2 to an atmosphere that is suitable for processing the product wafer Pn. Thereafter, 25 sheets of the product wafers P1 to P25 are transferred.

Figure 9A:
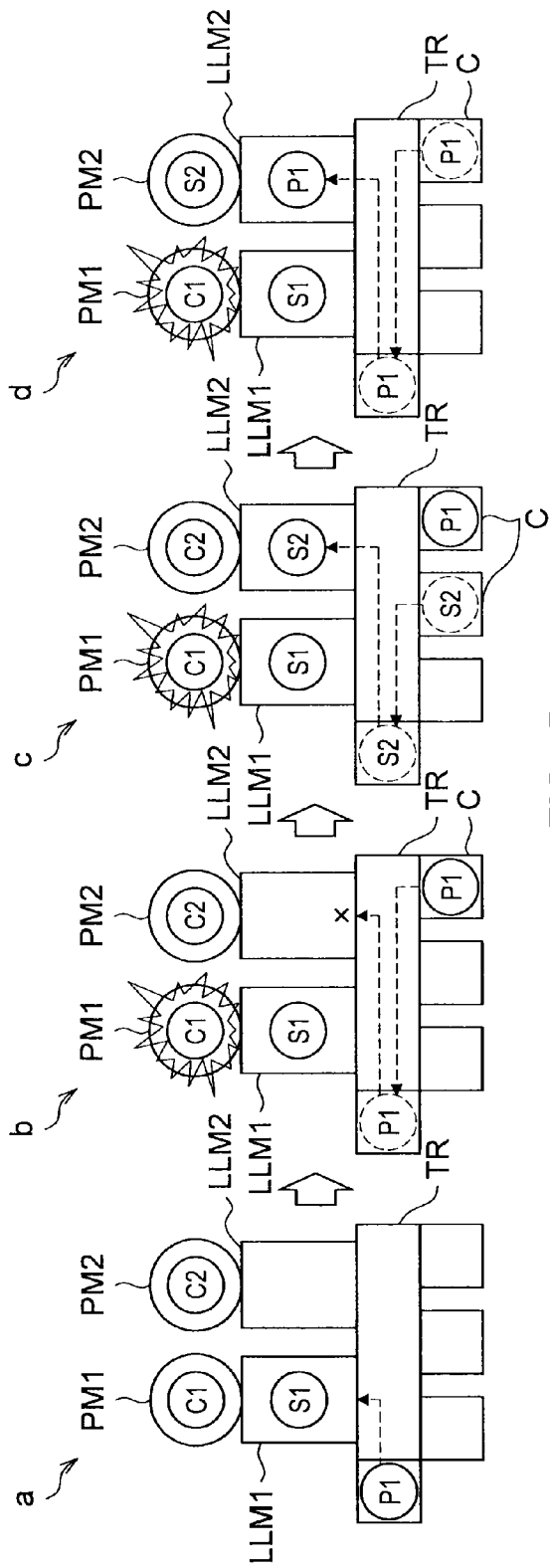
FIG. 9A is another diagram showing the transfer state in the processing system according to the embodiment.

FIG. 9A(a) shows a situation in which, by the OR transfer of the wafers, the cleaning wafers C1, C2 of the lot number specified by the operator are respectively transferred to the PM1 and PM2, and then the lot stabilizing dummy wafer S1 is transferred to the LLM1, and it is determined that the transfer destination of the product wafer P1 is the PM1. In this situation, an abnormality occurs in the PM1.

Interrupt Process at the Time of Occurrence of Abnormality

In the interrupt process at the time of occurrence of abnormality shown in FIG. 7 that is activated at this time, at step 705, the evacuation portion 260 evacuates, to the cassette case C, the product wafer P1 that has been waiting to be transferred to the PM1 in which an abnormality occurs. Then at step 710, if it is determined that the transfer destination of the product wafer P1 is the PM2, the transfer inhibition portion 265 identifies the process that is performed in the PM2 immediately before processing the evacuated wafer. As shown in FIG. 9A(b), the process that is performed in the PM2 immediately before processing the evacuated wafer P1 is the cleaning process.

Next, the process proceeds to step 715, and the transfer inhibition portion 265 determines whether or not the processing of the evacuated wafer P1 following the immediately preceding process is inhibited, based on a predetermined condition. In this embodiment, after cleaning the inside of the normal PM2, the seasoning process is required prior to the processing of the product wafers. Accordingly, after cleaning, the inside of the PM2 before seasoning has not been adjusted to a condition good enough to process the product wafers. Therefore, if the evacuated wafer P1 is processed in the PM2, there is a possibility that the properties of the processed wafer P1 will not reach a level sufficient for the wafer P1 to be shipped as a product.

To address this, in the interrupt process at the time of occurrence of abnormality according to the embodiment, when in the above transfer situation, at step 715 of FIG. 7, the transfer inhibition portion 265 determines that the transfer of the evacuated wafer P1 to the normal PM2 is inhibited. Then, the process proceeds to step 720, and the transfer destination determining portion 255 determines the transfer destination such that, after the abnormal PM1 is recovered, the evacuated wafer P1 is transferred to the recovered PM1. Then, at step 795, the process is terminated once.

Figure 9B:
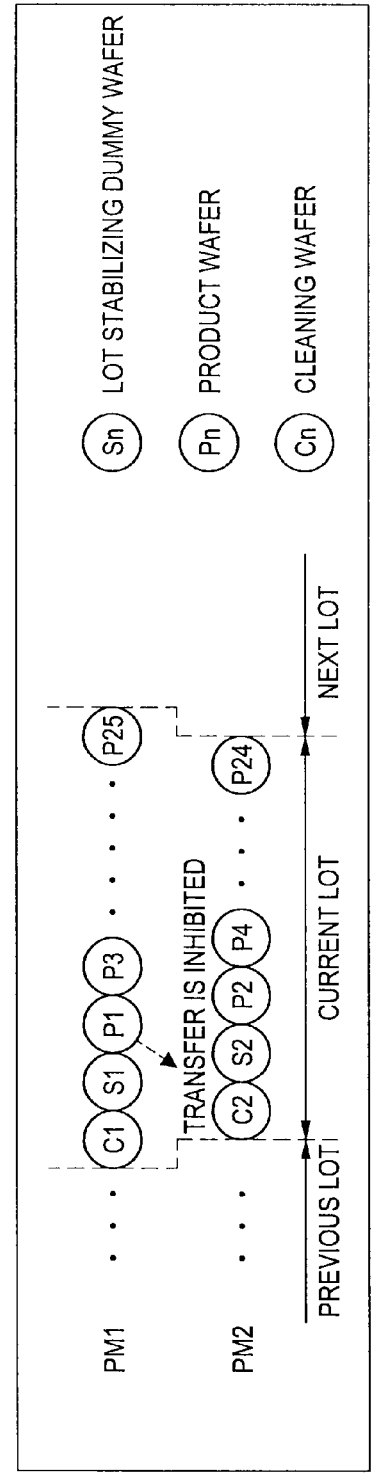
FIG. 9B is a diagram for explaining the transfer state shown in FIG. 9A.

Accordingly, as shown in FIG. 9B, as a result of inhibiting the transfer of the evacuated wafer P1 to the normally operating PM2, the product wafers P1 to P25 are processed after processing both the PM1 and PM2 using the cleaning wafers C1, C2 and then using the lot stabilizing dummy wafers S1, S2. Therefore, the properties of all the product wafers can be kept in a good condition. In addition, there is no variation in the properties of the product wafers included in the current lot, and thus a high yield can be maintained.

Note that, in a case where the abnormal PM1 is not recovered after a predetermined time has elapsed, the interrupt process at the time of occurrence of abnormality shown in FIG. 7 may be activated again. In this case, it is assumed that the lot stabilizing dummy wafer S2 has been transferred to the LLM2 as shown in FIG. 9A(c).

In this case, because the product wafer P1 has already been evacuated to the cassette case (step 705), the process proceeds to step 710. When it is determined again that the product wafer P1 is transferred to the normal PM2, the transfer inhibition portion 265 identifies the process that is performed in the PM2 immediately before processing the evacuated wafer P1. At this time point, the process that is performed in the PM2 immediately before processing the evacuated wafer P1 is the seasoning process.

Accordingly, the transfer inhibition portion 265 determines that the processing of the evacuated wafer P1 following the immediately preceding process identified at step 715 is not inhibited. Then, the process proceeds to step 725, and the transfer destination determining portion 255 determines that the evacuated wafer P1 is to be transferred to the normal PM2. Then, the process is terminated once at step 795.

As a result, the product wafers P1 to P25 are processed after processing both the PM1 and PM2 using the cleaning wafers C1, C2 and then using the lot stabilizing dummy wafers S1, S2 as shown in FIG. 9A(d). Accordingly, depending on the recovery condition of the abnormal PM, each wafer can be transferred to the plurality of PMs appropriately. Thus, the overall efficiency of the processing system can be maintained even when an abnormality occurs.

As explained above, in the processing system 10 according to the embodiment, in a case where an abnormality occurs in one of the PMs, even when the processing chamber that is the transfer destination is operating normally, if the process that is performed immediately before processing the object to be processed corresponds to a predetermined condition, the transfer of the object to be processed can be inhibited. Examples of the predetermined condition include the case when the inside of the processing chamber has not been adjusted to a stable state, and the case when the inside of the processing chamber has been adjusted to a condition to receive the next lot.

In a case where the processing system 10 has three or more PMs, when it is determined at step 715 that the transfer of the evacuated wafer to the normal PM is inhibited, another PM that is operating normally may be specified as a new transfer destination for the evacuated wafer, instead of transferring the evacuated wafer to the recovered PM after waiting for the recovery of the abnormal PM at step 720.

The evacuation portion 260 determines that the wafer has been transferred to the transfer destination PM when the wafer is transferred to the LLM. However, the evacuation portion 260 may determine that the wafer has been transferred to the transfer destination PM when the wafer is transferred to one of the PMs.

Further, the transfer inhibit portion 265 may determine the immediately preceding process that is performed in the PM that is the new transfer destination of the evacuated wafer, based on the processing procedure shown in the recipe. By doing this, even when cleaning or seasoning the PM, in a wafer-less state, without using the lot stabilizing dummy wafers, it is possible to accurately determine the immediately preceding process that is performed in the transfer destination PM.

The respective processes and operations described above will be briefly outlined. An example of the predetermined condition to inhibit the transfer of the evacuated object to be processed is a case when the inside of the processing chamber that is the transfer destination has not been adjusted to a stable condition by the process performed immediately before processing the evacuated object to be processed.

More specifically, there is a case when the process immediately before processing the evacuated object to be processed is not the cleaning process when the inside of the processing chamber that is the transfer destination should be cleaned.

Also, there is a case when the process immediately before processing the evacuated object to be processed is not the seasoning process when the inside of the processing chamber that is the transfer destination after cleaning should be seasoned.

In such cases, the inside of the processing chamber that is the transfer destination has not been adjusted to a condition good enough to process the object to be processed. Accordingly, if the evacuated object to be processed is processed in the processing chamber, there is a possibility of producing a defective product.

Further, another example of the predetermined condition to inhibit the transfer of the evacuated object to be processed is a case when the inside of the processing chamber that is the transfer destination has been adjusted, by the process performed immediately before processing the evacuated object to be processed, to a condition suitable to receive the lot next to the lot including the evacuated object to be processed.

More specifically, there is a case when the inside of the processing chamber that is the transfer destination has been adjusted to a condition suitable to receive the next lot by the cleaning process performed immediately before processing the evacuated object to be processed.

Also, there is a case when the inside of the processing chamber that is the transfer destination has been adjusted to a condition to receive the next lot by the seasoning process performed immediately before processing the evacuated object to be processed.

In such cases, the inside of the processing chamber that is the transfer destination has been adjusted to an atmosphere to receive the next lot. Accordingly, if the evacuated object to be processed included in the current lot is processed in the processing chamber, the atmosphere in the processing chamber that is the transfer destination changes. Accordingly, when processing the object to be processed in the current lot or the next lot, there is a possibility of producing a defective product.

In this manner, if at least one defective product is produced from the objects to be processed in the lot, variation may be generated in the properties of the defective product and the other objects to be processed in the same lot that have undergone processing, and it may be determined in a later process that at least one of the objects to be processed included in the same lot is a product whose quality as a product is not ensured. Thus, there is a possibility that all the objects to be processed included in the same lot cannot be shipped as products.

In addition, the atmosphere in the processing chamber that is the transfer destination is changed to some degree by processing the evacuated object to be processed in the current lot. Accordingly, a further process is required to adjust the inside of the processing chamber that is the transfer destination to an atmosphere to receive the next lot. This may reduce the overall throughput of the processing system.

On the other hand, in the present invention, even when the processing chamber is operating normally, if the process that is performed immediately before processing the object to be processed corresponds to a predetermined condition, the transfer of the object to be processed to the processing chamber is inhibited. Examples of the predetermined condition include the case when the inside of the processing chamber has not been adjusted to a stable state, and the case when the inside of the processing chamber has been adjusted to a condition to receive the next lot.

More specifically, when in a normal condition, the efficiency of the process is enhanced by the OR transfer, and when transfer to a certain processing chamber is inhibited due to an abnormality or the like, the object to be processed scheduled to be transferred to the transfer-inhibited processing chamber is evacuated, and the evacuated object to be processed is transferred to a new transfer destination. Although the above process is generally executed, when the above-described predetermined condition is met, the transfer of the object to be processed is inhibited. Thus, production of defective products is suppressed, and variation in the properties of the objects to be processed in the same lot is inhibited, resulting in an increase in the overall productivity of the processing system.

The transfer destination determining portion may determine the transfer destination of the object to be processed, the transfer of which has been inhibited by the transfer inhibition portion, such that the object to be processed is transferred to one of the other processing chambers that are operating normally, or after waiting for recovery of the processing chamber in which the abnormality has occurred, the object to be processed is transferred to the recovered processing chamber.

The processing system may further include a pre-processing chamber that connects, between each of the plurality of processing chambers and the transfer mechanism, each of the processing chambers and the transfer mechanism. When an object to be processed is transferred to the pre-processing chamber, the evacuation portion may determine that the object to be processed is transferred to the processing chamber that is the transfer destination.

When an object to be processed for cleaning is transferred from the transfer mechanism to the pre-processing chamber, the transfer inhibition portion may determine that the immediately preceding process performed in the processing chamber that is connected to the pre-processing chamber is a cleaning process.

When an object to be processed for seasoning is transferred from the transfer mechanism to the pre-processing chamber, the transfer inhibition portion may determine that the immediately preceding process performed in the processing chamber that is connected to the pre-processing chamber is a seasoning process.

Further, the transfer inhibition portion may determine, based on a processing procedure shown in a recipe, the immediately preceding process performed in the processing chamber. Thus, even when cleaning or seasoning the processing chamber without using a lot stabilizing dummy wafer, it is possible to accurately determine the immediately preceding process.

In accordance with the timing at which the object to be processed is transferred from the transfer mechanism to the pre-processing chamber, the transfer destination determining portion may determine the transfer destination of the next object to be processed that is stored in the storage port.

Alternatively, in accordance with the timing at which the object to be processed is transferred from the storage port to the transfer mechanism, the transfer destination determining portion may determine the transfer destination of the next object to be processed stored in the storage port.

During periodic maintenance of any one of the plurality of processing chambers, or when an abnormality occurs in any one of the processing chambers, the evacuation portion may determine that the transfer of an object to be processed to the given processing chambers is inhibited. Note that the processing system may be a system that processes a wafer or a substrate.

As described above, according to the present invention, when optimizing the transfer route depending on the operating state of each of the processing chambers, if a predetermined condition is met, the transfer to the determined transfer destination can be inhibited based on the content of the immediately preceding process performed in the processing chamber.

In the above-described embodiments, the operations of the respective portions are associated with each other, and can be replaced with a series of operations taking the relationship thereof into consideration. Thus, the embodiment of a control device for the processing system can be changed into the embodiment of a control method for the processing system. Further, by substituting the operations of the respective portions with the processes of the respective portions, the embodiment of the control method for the processing system can be changed into the embodiment of a processing program for controlling the processing system. Furthermore, by storing the processing program for controlling the processing system in a computer readable storage medium, the embodiment of the processing program for controlling the processing system can be changed into the embodiment of a computer readable storage medium that stores the processing program.

It should be understood by those skilled in the art that various modifications, combinations, sub-combinations and alterations may occur depending on design requirements and other factors insofar as they are within the scope of the appended claims or the equivalents thereof.

First Modified Example of the Processing System

Figure 10:
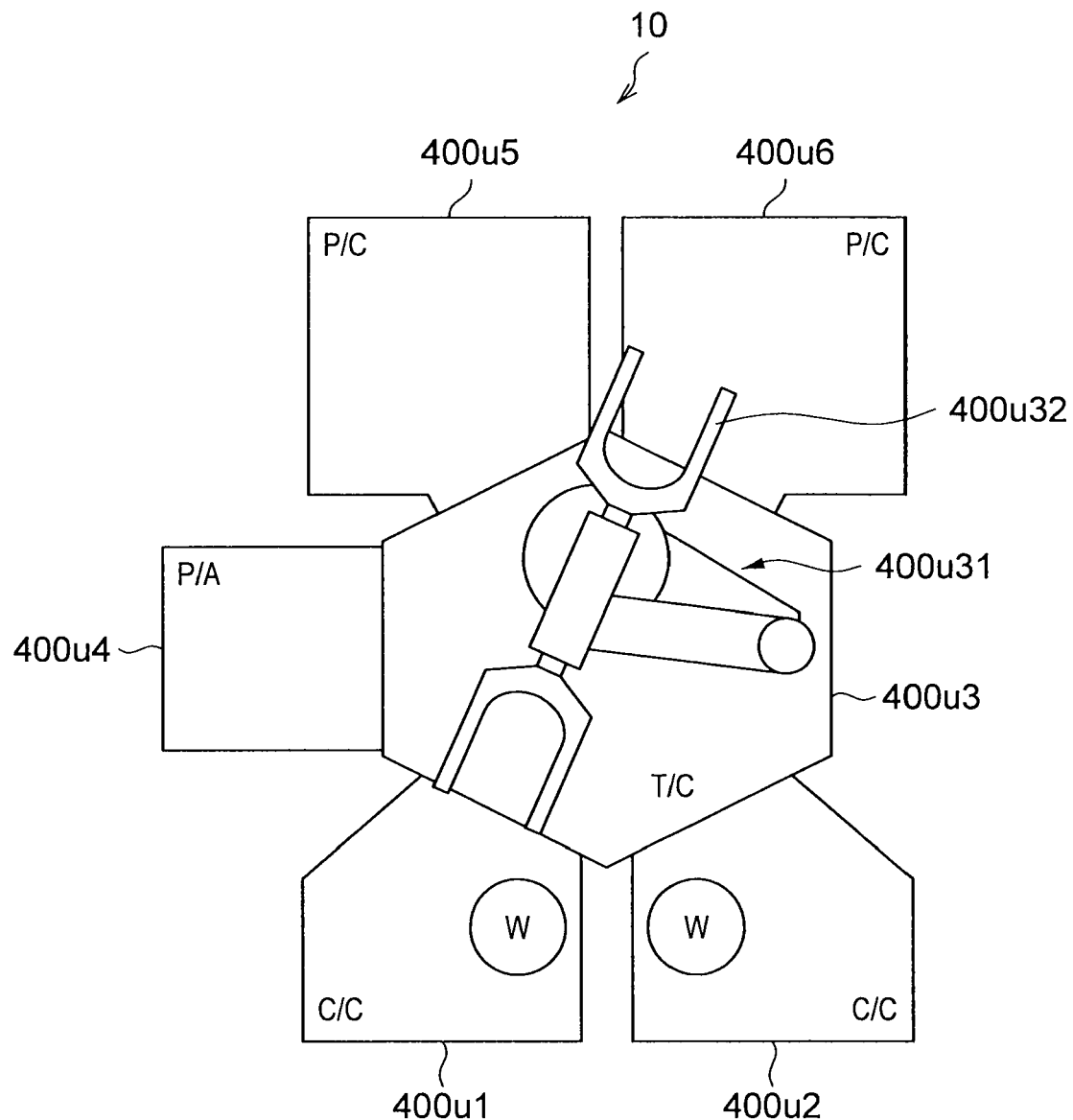
FIG. 10 is another internal configuration diagram of the processing system.

For example, the processing system 10 that performs the above-described transfer process (FIG. 5), wafer process (FIG. 6) and interrupt process at the time of occurrence of abnormality (FIG. 7) may have a configuration as shown in FIG. 10. The processing system 10 includes cassette chambers (C/C) 400*u*1, 400*u*2, a transfer chamber (T/C) 400*u*3, a pre-alignment (P/A) 400*u*4, and processing chambers (P/C) (=PM) 400*u*5, 400*u*6.

The C/C 400*u*1, 400*u*2 store wafers to be unprocessed and processed wafers, as well as cleaning wafers and lot stabilizing dummy wafers. The P/A 400*u*4 performs positioning of the wafer W.

The T/C 400*u*3 is provided with an articulated arm 400*u*31 that can bend, stretch and turn. The arm 400*u*31 has an end provided with a fork 400*u*32 on which a wafer is held, and transfers the wafer between the C/C 400*u*1, 400*u*2, the P/A 400*u*4, and the P/C 400*u*5, 400*u*6, while bending, stretching and turning as necessary.

With the above configuration, the processing system 10 transfers the wafer from the C/C 400*u*1, 400*u*2, via the T/C 400*u*3 and the P/A 400*u*4, to the P/C 400*u*5, 400*u*6, using the arm 400*u*31 of the T/C 400*u*3. After performing a process such as an etching process on the wafer, the processing system 10 transfers the processed wafer to the C/C 400*u*1, 400*u*2, via the T/C 400*u*3 again.

Second Modified Example of the Processing System

Figure 11:
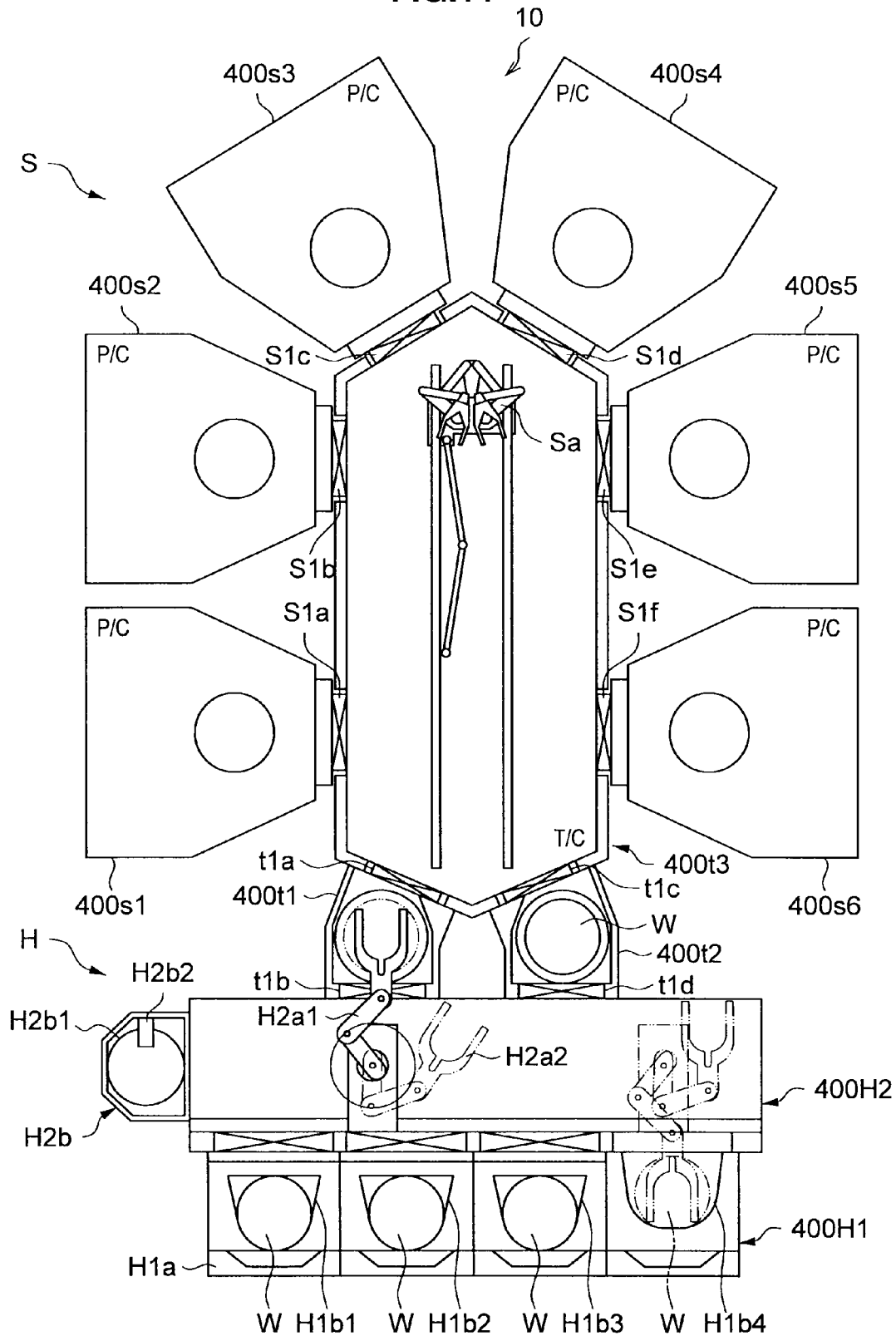
FIG. 11 is another internal configuration diagram of the processing system.

Further, the processing system 10 of the present invention may have a configuration as shown in FIG. 11. The processing system 10 includes a transfer system H that transfers the wafer W, and a processing system S that performs a process such as a deposition process or an etching process on the wafer W. The transfer system H and the processing system S are connected via LLM 400*t*1, 400*t*2.

The transfer system H includes a cassette stage 400H1 and a transfer stage 400H2. The cassette stage 400H1 is provided with a cassette case susceptor H1*a*. Four cassette cases H1*b*1 to H1*b*4 are placed on the cassette case susceptor H1*a*. Each cassette case H1*b* stores the wafers W to be unprocessed, processed wafers, and wafers for dummy process used for cleaning and seasoning in a multiple levels.

Two transfer arms H2*a*1, H2*a*2 that can bend, stretch and turn are supported by the transfer stage 400H2 such that the transfer arms H2*a*1, H2*a*2 slide when they are magnetically driven. Each of the transfer arms H2*a*1, H2*a*2 has an end provided with a fork on which the wafer W is held.

A alignment mechanism H2*b* that performs positioning of the wafer W is provided at an end of the transfer stage 400H2. The alignment mechanism H2*b* detects the state of a peripheral section of the wafer W using an optical sensor H2*b*2, while rotating a turntable H2*b*1 on which the wafer W is placed, thereby positioning the wafer W.

A susceptor on which the wafer W is placed is provided in each of the LLM 400*t*1, 400*t*2, and gate valves t1*a*, t1*b*, t1*c*, t1*d* are provided at opposite ends of the LLM 400*t*1, 400*t*2. With this configuration, the transfer system H transfers the wafer W between the cassette cases H1*b*1 to H1*b*4, the LLM 400*t*1, 400*t*2, and the alignment mechanism H2*b*.

The processing system S includes a transfer chamber (T/C) (=TM) 400*t*3 and six processing chambers (P/C) 400*s*1 to 400*s*6 (=PM). The transfer chamber T/C 400*t*3 is connected to the P/C 400*s*1 to 400*s*6 via gate valves s1*a* to s1*f*, respectively. T/C 400*t*3 is provided with an arm Sa that can bend, stretch and turn.

With the above configuration, the processing system 10 transfers the wafer, which has been transferred from the transfer system H to the processing system S, from the LLM 400*t*1, 400*t*2, via the T/C 400*t*3, to the P/C 400*s*1 to 400*s*6, using the arm Sa. After performing a process such as an etching process on the wafer, the processing system 10 transfers the processed wafer to the LLM 400*t*1, 400*t*2, via the T/C 400*t*3 again. Each of the transfer arms H2*a*1, H2*a*2 receives the processed wafer and returns it to the cassette case H1*b*.

As shown in FIG. 10 and FIG. 11, also in the processing system 10 having three or more PMs, the wafers are sequentially transferred to the respective P/Cs. The concept of the OR transfer includes a case in which wafers are sequentially transferred to three or more PMs (processing chambers) in this manner. Also in this case, by performing the interrupt process at the time of occurrence of abnormality as shown in FIG. 7, respective objects to be processed can be transferred to a plurality of processing chambers appropriately, depending on the condition of processing chambers that are operating normally and the condition of processing chambers in which an abnormality has occurred. Thus, the overall efficiency of the processing system can be maintained even when an abnormality occurs.

There is no limitation on the number of the processing chambers in the processing system of the present invention. In addition, the object to be processed used in the present invention is not limited to a silicon wafer, and it may be a substrate of quartz, glass, or the like.

Further, examples of the apparatus that performs a desired process in the processing chamber include, an etching apparatus, a chemical vapor deposition (CVD) apparatus, an ashing apparatus, a spattering apparatus, a coater developer, a cleaning apparatus, a chemical mechanical polishing (CMP) apparatus, a physical vapor deposition (PVD) apparatus, an exposure apparatus, an ion implanter, etc. These apparatuses may be embodied by a microwave plasma processing apparatus, an inductive coupled plasma processing apparatus, a capacity coupled plasma processing apparatus, etc.

Furthermore, the control device according to the present invention may be embodied by the EC 200 only, or may be embodied by the EC 200 and the MC 300.

What is claimed is:

1. A control device for a processing system, wherein the processing system includes a plurality of processing chambers in which a predetermined process is performed on an object to be processed, a storage port that stores objects to be processed, and a transfer mechanism that transfers each object to be processed to a predetermined transfer destination between the plurality of processing chambers and the storage port, wherein the control device comprises:
    a transfer destination determining portion that determines a first transfer destination of each object to be processed that is stored in the storage port such that each object to be processed is sequentially transferred to a processing chamber that is operating normally among the plurality of processing chambers;
    an evacuation portion that, when transfer of an object to be processed to one of the plurality of processing chambers is inhibited, temporarily evacuates the object to be processed that has been determined to be transferred to the processing chamber to which the transfer is inhibited and that has not yet been transferred to the processing chamber to which the transfer is inhibited; and
    a transfer inhibition portion that, when the transfer destination determining portion determines a second transfer destination for the evacuated object to be processed, and upon determination that a process that is performed immediately before processing the evacuated object to be processed in the second transfer destination satisfies a predetermined condition, inhibits the transfer of the evacuated object to be processed to the second transfer destination,
    wherein, the predetermined condition to inhibit the transfer of the evacuated object to be processed includes a case when the inside of the processing chamber that is the first transfer destination has not been adjusted to a stable condition by the process performed immediately before processing the evacuated object to be processed, and
    wherein, the predetermined condition to inhibit the transfer of the evacuated object to be processed includes a case when the process immediately before processing the evacuated object to be processed is not a cleaning process when the inside of the processing chamber that is the first transfer destination should be cleaned.

2. A control device for a processing system, wherein the processing system includes a plurality of processing chambers in which a predetermined process is performed on an object to be processed, a storage port that stores objects to be processed, and a transfer mechanism that transfers each object to be processed to a predetermined transfer destination between the plurality of processing chambers and the storage port, wherein the control device comprises:
    a transfer destination determining portion that determines a first transfer destination of each object to be processed that is stored in the storage port such that each object to be processed is sequentially transferred to a processing chamber that is operating normally among the plurality of processing chambers;
    an evacuation portion that, when transfer of an object to be processed to one of the plurality of processing chambers is inhibited, temporarily evacuates the object to be processed that has been determined to be transferred to the processing chamber to which the transfer is inhibited and that has not yet been transferred to the processing chamber to which the transfer is inhibited; and
    a transfer inhibition portion that, when the transfer destination determining portion determines a second transfer destination for the evacuated object to be processed, and upon determination that a process that is performed immediately before processing the evacuated object to be processed in the second transfer destination satisfies a predetermined condition, inhibits the transfer of the evacuated object to be processed to the second transfer destination,
    wherein, the predetermined condition to inhibit the transfer of the evacuated object to be processed includes a case when the inside of the processing chamber that is the first transfer destination has not been adjusted to a stable condition by the process performed immediately before processing the evacuated object to be processed, and
    wherein, the predetermined condition to inhibit the transfer of the evacuated object to be processed includes a case when the process immediately before processing the evacuated object to be processed is not a seasoning process when the inside of the processing chamber that is the first transfer destination after cleaning should be seasoned.

3. The control device for the processing system according to claim 1, wherein, the transfer destination determining portion determines the first transfer destination of the object to be processed, the transfer of which has been inhibited by the transfer inhibition portion, such that the object to be processed is transferred to one of the other processing chambers that are operating normally, or after waiting for recovery of the processing chamber in which an abnormality has occurred, the object to be processed is transferred to the recovered processing chamber.

4. The control device for the processing system according to claim 1, wherein
    the processing system further includes a pre-processing chamber that connects, between each of the plurality of processing chambers and the transfer mechanism, each of the processing chambers and the transfer mechanism, and
    when an object to be processed is transferred to the pre-processing chamber, the evacuation portion determines that the object to be processed is transferred to the processing chamber that is the first transfer destination.

5. The control device for the processing system according to claim 4, wherein, when an object to be processed for cleaning is transferred from the transfer mechanism to the pre-processing chamber, the transfer inhibition portion determines that the immediately preceding process performed in the processing chamber that is connected to the pre-processing chamber is a cleaning process.

6. The control device for the processing system according to claim 4, wherein, when an object to be processed for seasoning is transferred from the transfer mechanism to the pre-processing chamber, the transfer inhibition portion determines that the immediately preceding process performed in the processing chamber that is connected to the pre-processing chamber is a seasoning process.

7. The control device for the processing system according to claim 4, wherein, in accordance with a timing at which the object to be processed is transferred from the transfer mechanism to the pre-processing chamber, the transfer destination determining portion determines a first transfer destination of a next object to be processed that is stored in the storage port.

8. The control device for the processing system according to claim 1, wherein, in accordance with a timing at which the object to be processed is transferred from the storage port to the transfer mechanism, the transfer destination determining portion determines a first transfer destination of a next object to be processed that is stored in the storage port.

9. The control device for the processing system according to claim 1, wherein, during periodic maintenance of any one of the plurality of processing chambers, or when an abnormality occurs in any one of the processing chambers, the evacuation portion determines that the transfer of an object to be processed to the determined processing chambers is inhibited.

10. The control device for the processing system according to claim 1, wherein, the processing system is a system that processes one of a wafer and a substrate.

11. A control device for a processing system, wherein the processing system includes a plurality of processing chambers in which a predetermined process is performed on an object to be processed, a storage port that stores objects to be processed, and a transfer mechanism to transfer each object to be processed to a predetermined transfer destination between the plurality of processing chambers and the storage port, wherein the control device comprises:
 a transfer destination determining portion that determines a first transfer destination of each object to be processed that is stored in the storage port such that each object to be processed is sequentially transferred to a processing chamber that is operating normally among the plurality of processing chambers;
 an evacuation portion that, when transfer of an object to be processed to one of the plurality of processing chambers is inhibited, temporarily evacuates the object to be processed that has been determined to be transferred to the processing chamber to which the transfer is inhibited and that has not yet been transferred to the processing chamber to which the transfer is inhibited; and
 a transfer inhibition portion that, when the transfer destination determining portion determines a second transfer destination for the evacuated object to be processed, and upon determination that a process that is performed immediately before processing the evacuated object to be processed in the second transfer destination satisfies a predetermined condition, inhibits the transfer of the evacuated object to be processed to the second transfer destination,
 wherein, the predetermined condition to inhibit the transfer of the evacuated object to be processed includes a case when the inside of the processing chamber that is the first transfer destination has been adjusted to receive a lot next to a lot including the evacuated object to be processed by the process performed immediately before processing the evacuated object to be processed.

12. The control device for the processing system according to claim 11, wherein, the predetermined condition to inhibit the transfer of the evacuated object to be processed includes a case when the inside of the processing chamber that is the first transfer destination has been adjusted to receive the next lot by a cleaning process performed immediately before processing the evacuated object to be processed.

13. The control device for the processing system according to claim 11, wherein, the predetermined condition to inhibit the transfer of the evacuated object to be processed includes a case when the inside of the processing chamber that is the first transfer destination has been adjusted to receive the next lot by a seasoning process performed immediately before processing the evacuated object to be processed.

14. A control method for a processing system, wherein the processing system includes a plurality of processing chambers in which a predetermined process is performed on an object to be processed, a storage port that stores objects to be processed, and a transfer mechanism that transfers each object to be processed to a predetermined transfer destination among the plurality of processing chambers and the storage port, the control method comprising the steps of:
 determining a first transfer destination of each object to be processed that is stored in the storage port such that each object to be processed is sequentially transferred to a processing chamber that is operating normally among the plurality of processing chambers;
 temporarily evacuating, when transfer of an object to be processed to one of the plurality of processing chambers is inhibited, the object to be processed that it has been determined is to be transferred to the processing chamber to which the transfer is inhibited and that has not yet been transferred to the processing chamber to which the transfer is inhibited;
 determining a second transfer destination for the evacuated object to be processed; and
 inhibiting the transfer of the evacuated object to be processed to the second transfer destination, if a process that is performed immediately before processing the evacuated object to be processed in the second transfer destination satisfies a predetermined condition,
 wherein, the predetermined condition to inhibit the transfer of the evacuated object to be processed includes a case when the inside of the processing chamber that is the transfer destination has not been adjusted to a stable condition by the process performed immediately before processing the evacuated object to be processed, and
 wherein, the predetermined condition to inhibit the transfer of the evacuated object to be processed includes a case when the process immediately before processing the evacuated object to be processed is not a cleaning process when the inside of the processing chamber that is the first transfer destination should be cleaned.

15. A non-transitory computer readable storage medium having instructions stored therein, which when executed by a processor in a control device for a processing system causes the control device to execute a method for controlling the processing system, wherein the processing system includes a plurality of processing chambers in which a predetermined process is performed on an object to be processed, a storage port that stores objects to be processed, and a transfer mechanism that transfers each object to be processed to a predetermined transfer destination among the plurality of processing chambers and the storage port, the method comprising:
 determining a first transfer destination of each object to be processed that is stored in the storage port such that each object to be processed is sequentially transferred to a processing chamber that is operating normally among the plurality of processing chambers;
 temporarily evacuating, when transfer of an object to be processed to one of the plurality of processing chambers is inhibited, the object to be processed that has been determined to be transferred to the processing chamber to which the transfer is inhibited and that has not yet been transferred to the processing chamber to which the transfer is inhibited;
 determining a second transfer destination for the evacuated object to be processed; and
 inhibiting the transfer of the evacuated object to be processed to the second transfer destination, if a process that is performed immediately before processing the evacuated object to be processed in the second transfer destination satisfies a predetermined condition wherein, the predetermined condition to inhibit the transfer of the evacuated object to be processed includes a case when the inside of the processing chamber that is the transfer destination has not been adjusted to a stable condition by the process performed immediately before processing the evacuated object to be processed, and wherein, the predetermined condition to inhibit the transfer of the evacuated object to be processed includes a case when the process immediately before processing the evacuated object to be processed is not a cleaning process when the inside of the processing chamber that is the first transfer destination should be cleaned.

\* \* \* \* \*